US010187097B2

United States Patent
Iida

(10) Patent No.: US 10,187,097 B2
(45) Date of Patent: Jan. 22, 2019

(54) NOTCH FILTER

(71) Applicant: Sony Corporation, Tokyo (JP)

(72) Inventor: Sachio Iida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/523,536

(22) PCT Filed: Nov. 12, 2015

(86) PCT No.: PCT/JP2015/081824
§ 371 (c)(1),
(2) Date: May 1, 2017

(87) PCT Pub. No.: WO2016/084609
PCT Pub. Date: Jun. 2, 2016

(65) Prior Publication Data
US 2017/0310349 A1    Oct. 26, 2017

(30) Foreign Application Priority Data
Nov. 25, 2014    (JP) .................. 2014-237703

(51) Int. Cl.
| H03K 5/00 | (2006.01) |
| H04B 1/10 | (2006.01) |
| H03D 7/16 | (2006.01) |
| H03H 7/12 | (2006.01) |
| H04B 1/12 | (2006.01) |
| H03H 19/00 | (2006.01) |

(52) U.S. Cl.
CPC ........... *H04B 1/1036* (2013.01); *H03D 7/161* (2013.01); *H03H 7/12* (2013.01); *H03H 19/002* (2013.01); *H04B 1/123* (2013.01); *H04B 2001/1063* (2013.01)

(58) Field of Classification Search
CPC .................................................. H04B 1/1036
See application file for complete search history.

(56) References Cited

U.S. PATENT DOCUMENTS

2007/0132507 A1*  6/2007  Gatta ................. H03H 11/1239
327/552

FOREIGN PATENT DOCUMENTS

| JP | 2010268135 A | 11/2010 |
| JP | 2012531094 A | 12/2012 |
| WO | 2008032635 A1 | 3/2008 |

OTHER PUBLICATIONS

A. Ghaffari, E. Klumperrink, and B. Nauta, "8-Path tunable RF notch filters for blocker suppression," Solid-State Circuits Conference Digest of Technical Papers (ISSCC),2012 IEEE International, pp. 76-78, Feb. 2012.

* cited by examiner

*Primary Examiner* — Daniel Puentes
(74) *Attorney, Agent, or Firm* — Michael Best & Friedrich LLP

(57) ABSTRACT

The present technology relates to a notch filter capable of easily obtaining a desired frequency characteristic. In an N-path filter unit, any one of a plurality of N capacitors is selected as a signal path through which a signal passes, so that the capacitor serving as the signal path is temporally switched. A plurality of N-path filter units is cascade-connected and a capacitor is inserted to a connection point between the N-path filter units. The present technology may be applied to the notch filter which eliminates a blocker and the like, for example.

4 Claims, 21 Drawing Sheets

NOTCH FILTER

TECHNICAL FIELD

The present technology relates to a notch filter and especially relates to the notch filter capable of easily obtaining a desired frequency characteristic, for example.

BACKGROUND ART

There is a notch filter referred to as an N-path filter (N-path notch filter), for example, as the notch filter; this is used for eliminating a blocker and the like in wireless communication, for example.

That is to say, the notch filter is used for eliminating an interferer/blocker of 13.56 MHz emitted by a near field communication (NFC) device in a receiver of a body area network (BAN), for example.

Herein, the BAN is a new communication standard for which international standards such as IEEE 802.15.6 and ECMA-401 are issued recently. The BAN is assumed to be applied to short-distance non-contact wireless communication between a wearable device mounted on a human body and a portable terminal such as a cell phone with low power consumption, for example.

Also, NFC being non-contact wireless communication at a close distance of few centimeters is standardized as ISO/IEC 18092 (NFCIP-1). The NFC is used in an electronic commuter pass, electronic money and the like, for example, and a portable terminal such as a cell phone having a function of such electronic commuter pass and electronic money is widespread.

Therefore, it is supposed that the portable terminal performs both BAN and NFC communication.

Although communication is performed at approximately 40 Mbps at a maximum by using a minute induced electric field of a wide range of frequency band from few MHz to several tens of MHz in the BAN, data communication is performed at a relatively low speed of 424 kbps at a maximum by using a relatively narrow frequency band of approximately 1 MHz in the vicinity of 13.56 MHz in the NFC.

Since the communication is performed while power is supplied by using the induced magnetic field in the NFC, transmission power becomes larger as compared to that in the BAN, so that a notch filter which prevents an interferer/blocker from the NFC is required in the receiver of BAN.

It is confirmed that the interferer/blocker from the NFC is stronger than the signal of the BAN by approximately 30 dB by experiment; both the BAN and the NFC have frequency deviation of ±50 ppm at a maximum. Therefore, the notch filter is requested to correctly adjust a central frequency thereof to 13.56 MHz and eliminate a range of approximately ±100 ppm around the same with an attenuation amount of 30 dB or larger.

Realization of the notch filter which eliminates such a correct frequency band is difficult by using a continuous-time analog circuit in which the central frequency easily changes due to variation of an element constant, so that it is considered to realize the same by using a discrete-time analog circuit operating with a clock.

There is an N-path filter, for example, as a notch filter which eliminates a narrow-band blocker by using the discrete-time analog circuit (for example, refer to Non-Patent Document 1).

CITATION LIST

Non-Patent Document

Non-Patent Document 1: A. Ghaffari, E. Klumperrink, and B. Nauta, "8-Path tunable RF notch filters for blocker suppression," Solid-State Circuits Conference Digest of Technical Papers (ISSCC), 2012 IEEE International, pp. 76-78, February 2012.

SUMMARY OF THE INVENTION

Problems to be Solved by the Invention

An N-path filter disclosed in Non-Patent Document 1 cannot easily increase an attenuation amount and change a central frequency, so that there is a case in which a desired frequency characteristic cannot be easily obtained.

The present technology is achieved in view of such a condition, and an object thereof is to easily obtain the desired frequency characteristic.

Solutions to Problems

A first notch filter according to the present technology is a notch filter including a plurality of cascade-connected N-path filter units in which any one of a plurality of N capacitors is selected as a signal path through which a signal passes, so that a capacitor serving as the signal path is temporally switched, and a capacitor inserted to a connection point of the N-path filter units.

In the first notch filter configured in the above-described manner, the capacitor serving as the signal path is temporally switched in a plurality of cascade-connected N-path filter units, so that a predetermined band is eliminated. Also, impedance matching is realized by the capacitor inserted to the connection point between the N-path filter units.

A second notch filter according to the present technology is a notch filter including an N-path filter unit including an input line to which a signal is input, and an output line from which the signal is output in which any one of a plurality of N capacitors is selected as a signal path through which the signal passes, so that a capacitor serving as the signal path is temporally switched, and a capacitor which connects the input line to the output line.

In the second notch filter configured in the above-described manner, the capacitor serving as the signal path is temporally switched in the N-path filter unit, so that a predetermined band is eliminated. Also, a central frequency of a predetermined band to be eliminated is changed by the capacitor which connects the input line to the output line.

Meanwhile, the notch filter may be an independent device or may be an internal block forming one device.

Effects of the Invention

According to the present technology, a desired frequency characteristic may be easily obtained.

Meanwhile, the effect is not necessarily limited to that herein described and may be any effect described in this disclosure.

MODE FOR CARRYING OUT THE INVENTION

<Configuration Example of Notch Filter Formed of N-path Filter>

Figure 1:
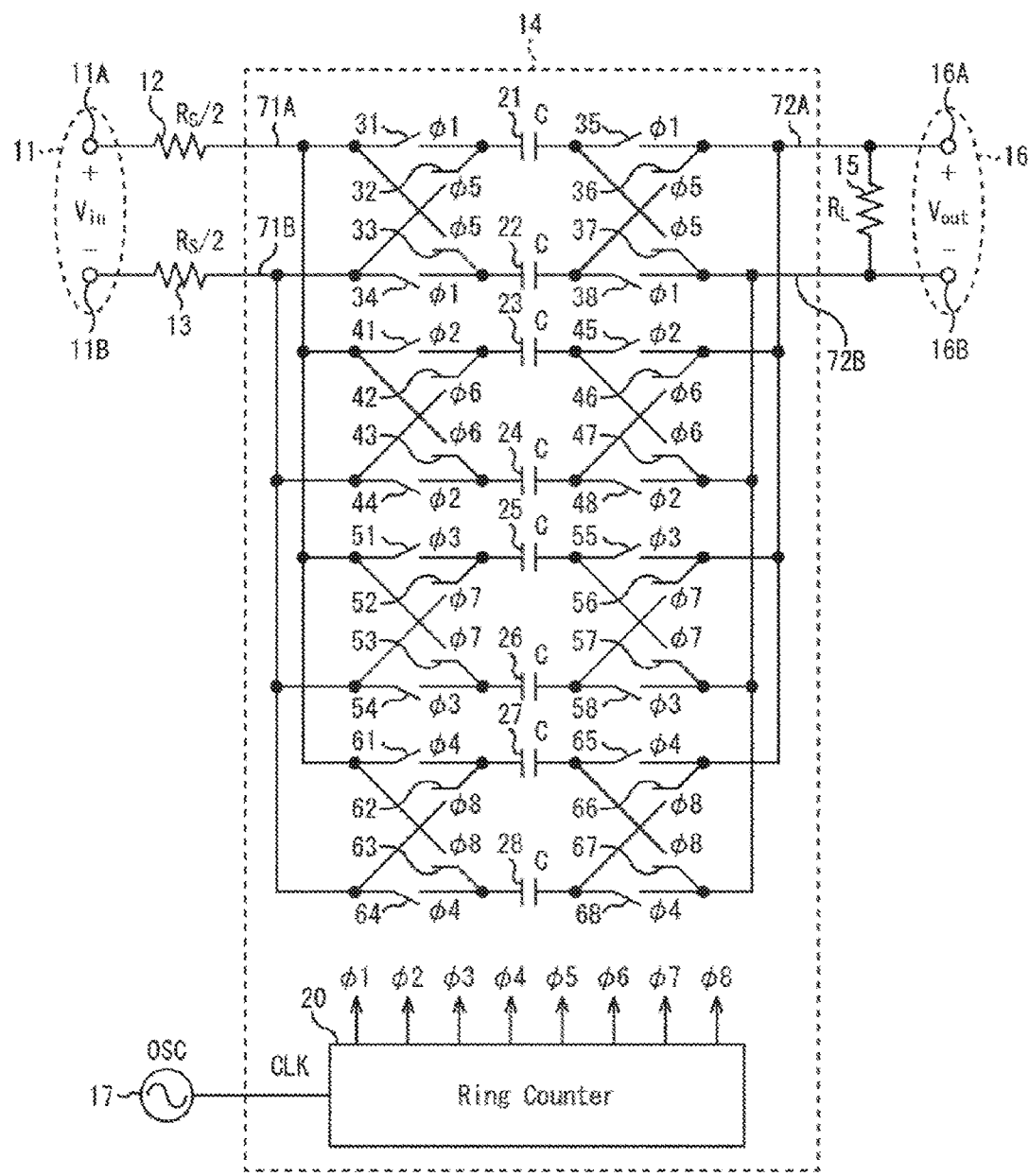
FIG. 1 is a block diagram illustrating a configuration example of a notch filter formed of an N-path filter.

FIG. 1 is a block diagram illustrating a configuration example of a notch filter formed of an N-path filter.

The notch filter in FIG. 1 formed of the N-path filter including eight paths (eight-path filter) eliminates (a frequency component of) a partial band of a differential signal from the differential signal as an input signal Vin and outputs the differential signal obtained after the elimination as an output signal Vout.

In FIG. 1, the notch filter includes a differential input terminal 11, resistances 12 and 13, a differential N-path filter unit 14, a resistance 15, a differential output terminal 16, and a clock oscillator 17.

The differential input terminal 11 includes a positive-phase input terminal 11A to which a positive-phase signal out of the differential signal formed of the positive-phase signal and a negative-phase signal is input and a negative-phase input terminal 11B to which the negative-phase signal out of the differential signal is input.

The resistance 12 is a signal source resistance on a positive-phase side: one end of which is connected to the positive-phase input terminal 11A and the other end of which is connected to a positive-phase signal input line 71A to be described later of the differential N-path filter unit 14.

The resistance 13 is a signal source resistance on a negative-phase side: one end of which is connected to the negative-phase input terminal 11B and the other end of which is connected to a negative-phase signal input line 71B to be described later of the differential N-path filter unit 14.

Meanwhile, the resistances having the same resistance value $R_S/2$ are adopted as the resistances 12 and 13.

The differential N-path filter unit 14 filters the differential signal input to the differential input terminal 11 to eliminate a partial band of the differential signal and outputs the differential signal after the elimination from a positive-phase signal output line 72A and a negative-phase signal output line 72B to be described later.

The resistance 15 is a differential load resistance having a resistance value of $R_L$ serving as a load of the differential signal output from the differential N-path filter unit 14. One end of the resistance 15 is connected to the positive-phase signal output line 72A and the other end thereof is connected to the negative-phase signal output line 72B.

The differential output terminal 16 includes a positive-phase output terminal 16A from which the positive-phase signal out of the differential signal is output and a negative-phase output terminal 16B from which the negative-phase signal out of the differential signal is output.

The positive-phase output terminal 16A is connected to a connection point of the positive-phase signal output line 72A of the differential N-path filter unit 14 and the resistance 15. The negative-phase output terminal 16B is connected to a connection point of the negative-phase signal output line 72B of the differential N-path filter unit 14 and the resistance 15.

The clock oscillator 17 generates a clock CLK of a predetermined frequency to supply to a ring counter 20 to be described later of the differential N-path filter unit 14.

The differential N-path filter unit 14 includes the ring counter 20, capacitors 21 to 28, and switches 31 to 38, 41 to 48, 51 to 58, and 61 to 68.

Furthermore, the differential N-path filter unit 14 includes the positive-phase signal input line 71A, the negative-phase signal input line 71B, the positive-phase signal output line 72A, and the negative-phase signal output line 72B.

The ring counter 20 counts the clocks CLK supplied from the clock oscillator 17 to generate eight-phase driving pulses phi (φ) 1 to phi8 set to a H level at different timings. Then, the ring counter 20 supplies the driving pulses phi of respective phases to necessary switches 31 to 38, 41 to 48, 51 to 58, and 61 to 68.

Each of the capacitors 21 to 28 is appropriately selected as a signal path through which a signal passes by turn-on of the necessary switch out of the switches 31 to 38, 41 to 48, 51 to 58, and 61 to 68, When each of the capacitors 21 to 28 is appropriately selected, the capacitor which serves as the signal path is temporally switched.

Meanwhile, the capacitors 21 to 28 are the capacitors having the same capacitance (electrostatic capacitance) C.

The switch 31 connects/disconnects the capacitor 21 to/from the positive-phase signal input line 71A according to the driving pulse phi1.

The switch 32 connects/disconnects the capacitor 21 to/from the negative-phase signal input line 71B according to the driving pulse phi5.

The switch 33 connects/disconnects the capacitor 22 to/from the positive-phase signal input line 71A according to the driving pulse phi5.

The switch 34 connects/disconnects the capacitor 22 to/from the negative-phase signal input line 71B according to the driving pulse phi1.

The switch 35 connects/disconnects the capacitor 21 to/from the positive-phase signal output line 72A according to the driving pulse phi1.

The switch 36 connects/disconnects the capacitor 22 to/from the positive-phase signal output line 72A according to the driving pulse phi5.

The switch 37 connects/disconnects the capacitor 21 to/from the negative-phase signal output line 72B according to the driving pulse phi5.

The switch 38 connects/disconnects the capacitor 22 to/from the negative-phase signal output line 72B according to the driving pulse phi1.

The switches 41 to 48 with respect to the capacitors 23 and 24 are configured so as to be similar to the switches 31 to 38 with respect to the capacitors 21 and 22.

The switches 51 to 58 with respect to the capacitors 25 and 26 are configured so as to be similar to the switches 31 to 38 with respect to the capacitors 21 and 22.

The switches 61 to 68 with respect to the capacitors 27 and 28 are configured so as to be similar to the switches 31 to 38 with respect to the capacitors 21 and 22.

However, the switches 41, 44, 45, and 48 are turned on/off according to the driving pulse phi2 and the switches 42, 43, 46, and 47 are turned on/off according to the driving pulse phi6.

Also, the switches 51, 54, 55, and 58 are turned on/off according to the driving pulse phi3 and the switches 52, 53, 56, and 57 are turned on/off according to the driving pulse phi7.

Furthermore, the switches 61, 64, 65, and 68 are turned on/off according to the driving pulse phi4 and the switches 62, 63, 66, and 67 are turned on/off according to the driving pulse phi8.

One end of the positive-phase signal input line 71A is connected to the positive-phase input terminal 11A through the resistance 12. The positive-phase signal is input from the positive-phase input terminal 11A to the positive-phase signal input line 71A through the resistance 12.

The other end of the positive-phase signal input line 71A is connected to one end of the capacitor 21 through the switch 31 and connected to one end of the capacitor 22 through the switch 33.

Furthermore, the other end of the positive-phase signal input line 71A is connected to one end of the capacitor 23 through the switch 41 and connected to one end of the capacitor 24 through the switch 43.

Also, the other end of the positive-phase signal input line 71A is connected to one end of the capacitor 25 through the switch 51, connected to one end of the capacitor 26 through the switch 53, connected to one end of the capacitor 27 through the switch 61, and connected to one end of the capacitor 28 through the switch 63.

One end of the negative-phase signal input line 71B is connected to the negative-phase input terminal 11B through the resistance 13. The negative-phase signal is input from the negative-phase input terminal 11B to the negative-phase signal input line 71B through the resistance 13.

The other end of the negative-phase signal input line 71B is connected to the one end of the capacitor 22 through the switch 34 and connected to the one end of the capacitor 21 through the switch 32.

Furthermore, the other end of the negative-phase signal input line 71B is connected to the one end of the capacitor 24 through the switch 44 and connected to the one end of the capacitor 23 through the switch 42.

Also, the other end of the negative-phase signal input line 71B is connected to the one end of the capacitor 26 through the switch 54, connected to the one end of the capacitor 25 through the switch 52, connected to the one end of the capacitor 28 through the switch 64, and connected to the one end of the capacitor 27 through the switch 62.

One end of the positive-phase signal output line 72A is connected to the positive-phase output terminal 16A. The positive-phase signal out of the differential signal filtered by the differential N-path filter unit 14 is output from the positive-phase signal output line 72A to be supplied to the positive-phase output terminal 16A.

The other end of the positive-phase signal output line 72A is connected to the other end of the capacitor 21 through the switch 35 and connected to the other end of the capacitor 22 through the switch 36.

Furthermore, the other end of the positive-phase signal output line 72A is connected to the other end of the capacitor 23 through the switch 45 and connected to the other end of the capacitor 24 through the switch 46.

Also, the other end of the positive-phase signal output line 72A is connected to the other end of the capacitor 25 through the switch 55, connected to the other end of the capacitor 26 through the switch 56, connected to the other end of the capacitor 27 through the switch 65, and connected to the other end of the capacitor 28 through the switch 66.

One end of the negative-phase signal output line 72B is connected to the negative-phase output terminal 16B. The negative-phase signal out of the differential signal filtered by the differential N-path filter unit 14 is output from the negative-phase signal output line 72B to be supplied to the negative-phase output terminal 16B.

The other end of the negative-phase signal output line 72B is connected to the other end of the capacitor 22 through the switch 38 and connected to the other end of the capacitor 21 through the switch 37.

Furthermore, the other end of the negative-phase signal output line 72B is connected to the other end of the capacitor 24 through the switch 48 and connected to the other end of the capacitor 23 through the switch 47.

Also, the other end of the negative-phase signal output line 72B is connected to the other end of the capacitor 26 through the switch 58, connected to the other end of the capacitor 25 through the switch 57, connected to the other end of the capacitor 28 through the switch 68, and connected to the other end of the capacitor 27 through the switch 67.

In the notch filter configured in the above-described manner, the switches 31 to 38, 41 to 48, 51 to 58, and 61 to 68 are appropriately temporally turned on according to the driving pulses phi.

For example, when the switches 31, 34, 35, and 38 are temporally turned on according to the driving pulse phi1, the positive-phase signal input from the positive-phase input terminal 11A to the positive-phase signal input line 71A through the resistance 12 passes through the signal path of the switch 31, the capacitor 21, and the switch 35 to be output from the positive-phase signal output line 72A. Furthermore, the negative-phase signal input from the negative-phase input terminal 11B to the negative-phase signal input line 71B through the resistance 13 passes through the signal path of the switch 34, the capacitor 22, and the switch 38 to be output from the negative-phase signal output line 72B.

Also, for example, when the switches 32, 33, 36, and 37 are temporally turned on according to the driving pulse phi5, the positive-phase signal input from the positive-phase input terminal 11A to the positive-phase signal input line 71A through the resistance 12 passes through the signal path of the switch 32, the capacitor 22, and the switch 36 to be output from the positive-phase signal output line 72A. Furthermore, the negative-phase signal input from the negative-phase input terminal 11B to the negative-phase signal input line 71B through the resistance 13 passes through the signal path of the switch 32, the capacitor 21, and the switch 37 to be output from the negative-phase signal output line 72B.

Also when other switches 41 to 48, 51 to 58, and 61 to 68 are appropriately temporally turned on, a similar process is performed. According to this, the differential signal formed of the positive-phase signal input to the positive-phase signal input line 71A and the negative-phase signal input to the negative-phase signal input line 71B is filtered by the differential N-path filter unit 14.

Then, the positive-phase signal out of the filtered differential signal is output from the positive-phase signal output line 72A to be supplied to the positive-phase output terminal 16A. Furthermore, the negative-phase signal out of the filtered differential signal is output from the negative-phase signal output line 72B to be supplied to the negative-phase output terminal 16B.

Figure 2:
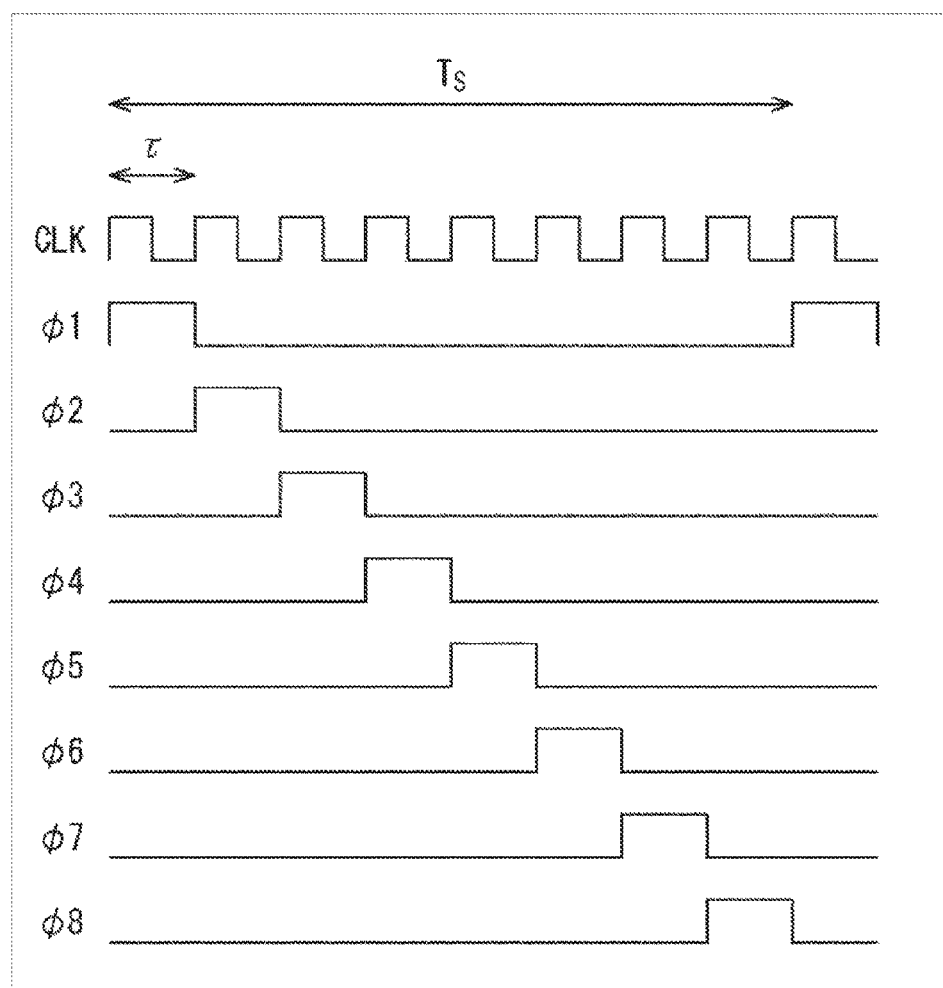
FIG. 2 is a waveform diagram illustrating an example of a clock CLK generated by a clock oscillator 17 and eight-phase driving pulses phi1 to phi8 generated by a ring counter 20.

FIG. 2 is a waveform diagram illustrating an example of the clock CLK generated by the clock oscillator 17 and the eight-phase driving pulses phi1 to phi8 generated by the ring counter 20.

The driving pulses phi1 to phi8 are the eight (=N)-phase pulses having a pulse width tau ($\tau$) equal to a period of the clock CLK, a period $T_S$ equal to eight (=N) times the pulse width tau, and a pulse position shifted by the pulse width tau.

The switches 31 to 38, 41 to 48, 51 to 58, and 61 to 68 are turned on when the driving pulse phi is set to the high (H) level and turned off when the driving pulse phi is set to a low (L) level.

A transfer function of the notch filter in FIG. 1 is represented by expression (1).

[Mathematical Expression 1]

$$H(s) = \frac{R_L}{R_S + R_L} \qquad (1)$$

$$\left[1 - \frac{N}{1+\frac{S}{\omega_{rc}}} \cdot \left\{\frac{1}{N} + \frac{1+e^{s\left(\frac{T_S}{2}-\tau\right)}}{\omega_{rc} \cdot T_S} \cdot \left(-\frac{e^{s\cdot\tau}-e^{-\omega_{rc}\cdot\tau}}{e^{s\cdot\frac{T_S}{2}}+e^{-\omega_{rc}\cdot\tau}} \cdot \frac{1}{1+\frac{S}{\omega_{rc}}}\right)\right\}\right]$$

$$\omega_{rc} = \frac{1}{(R_S + R_L)C}$$

In the notch filter in FIG. 1, N is 8. Also, in expression (1), tau=1/108.48 MHz, $T_S$=1/13.56 MHz, $R_S$/2=5 k$\Omega$, $R_L$=10 k$\Omega$, and C=4 pF are satisfied.

Figure 3:
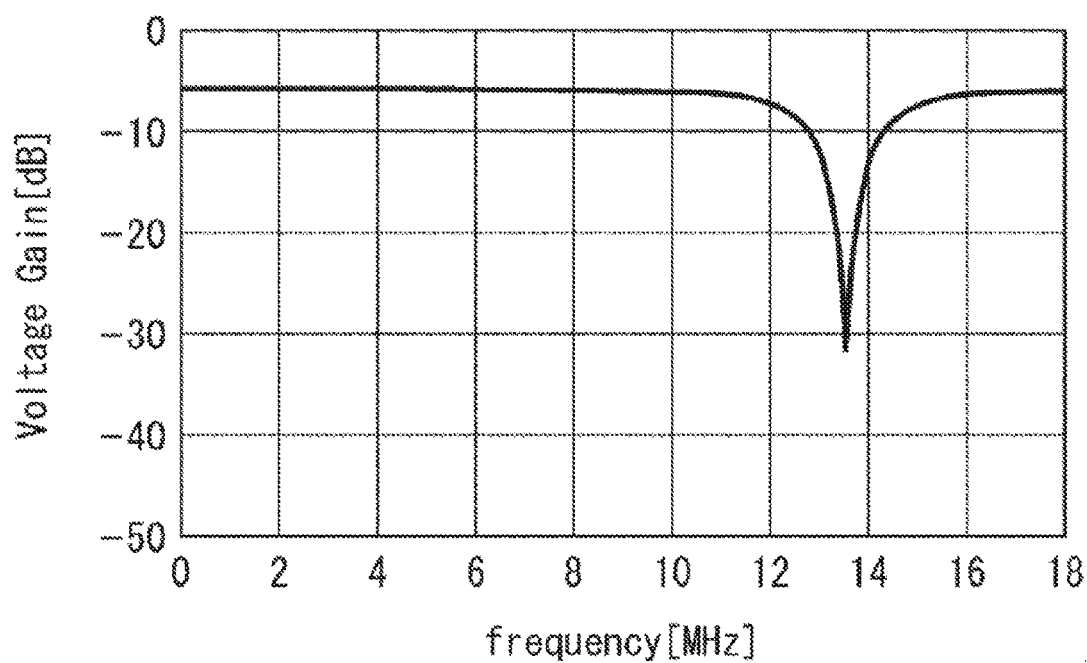
FIG. 3 is a view illustrating an example of a frequency characteristic of the notch filter.

A frequency characteristic of the notch filter in FIG. 1 in this case is illustrated in FIG. 3.

That is to say, FIG. 3 is a view illustrating an example of the frequency characteristic of the notch filter in FIG. 1.

The frequency characteristic of the notch filter in FIG. 1 is the characteristic of band elimination with a notch on $1/T_S$=13.56 MHz.

Figure 4:
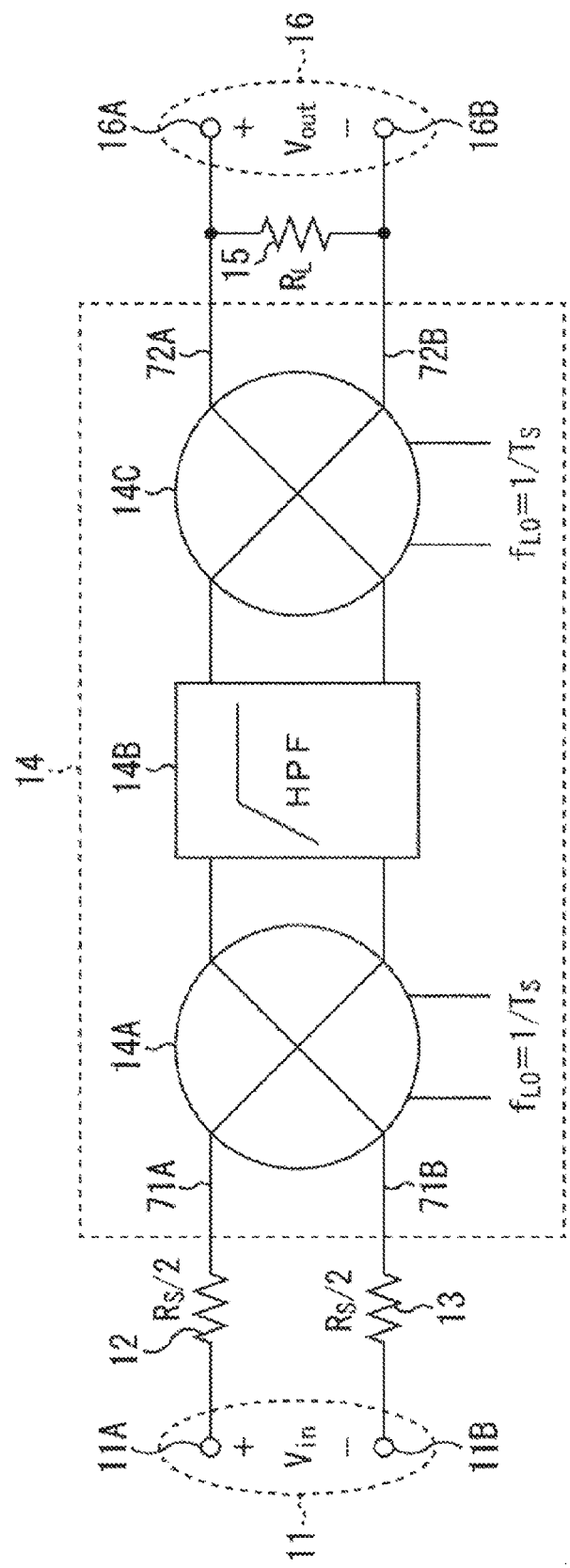
FIG. 4 is a block diagram illustrating a functional configuration of a differential N-path filter unit 14.

FIG. 4 is a block diagram illustrating a functional configuration of the differential N-path filter unit 14 in FIG. 1.

In FIG. 4, the differential N-path filter unit 14 is formed of a mixer 14A, a high pass filter (HPF) 14B, and a mixer 14C.

The mixer 14A corresponds to the switches 31 to 34, 41 to 44, 51 to 54, and 61 to 64.

The mixer 14A multiplies a local oscillator (LO) signal having a frequency of $1/T_S$ by each of the positive-phase signal from the positive-phase signal input line 71A and the negative-phase signal from the negative-phase signal input line 71B, thereby performing frequency conversion to decrease the frequency of the positive-phase signal and that of the negative-phase signal by $1/T_S$.

The positive-phase signal and the negative-phase signal obtained as a result of the frequency conversion by the mixer 14A are supplied to the HPF 14B.

The HPF 14B corresponds to the capacitors 21 to 28.

The HPF 14B filters the positive-phase signal and the negative-phase signal from the mixer 14A to cut a low-frequency component and supplies the positive-phase signal and the negative-phase signal obtained as a result to the mixer 14C.

The mixer 14C corresponds to the switches 35 to 38, 45 to 48, 55 to 58, and 65 to 68.

The mixer 14C multiplies the LO signal having a frequency of $1/T_S$ by each of the positive-phase signal and the negative-phase signal from the HPF 14B, thereby performing frequency conversion to increase the frequency of the positive-phase signal and that of the negative-phase signal by $1/T_S$.

The positive-phase signal obtained as a result of the frequency conversion by the mixer 14C is output from the positive-phase output terminal 16A through the positive-phase signal output line 72A. Also, the negative-phase signal obtained as a result of the frequency conversion by the mixer 14C is output from the negative-phase output terminal 16B through the negative-phase signal output line 72B.

In the differential N-path filter unit 14 in FIG. 4, the frequency conversion to decrease the frequency of the differential signal formed of the positive-phase signal and the negative-phase signal by $1/T_S$ is performed by the mixer 14A. Then, after the HPF 14B cuts the low-frequency component, the mixer 14C performs the frequency conversion to increase the frequency by $1/T_S$, so that the signal is returned to that having an original frequency band.

According to the differential N-path filter unit 14 as described above, the frequency component (spectral component) in the vicinity of the frequency $1/T_S$ of the LO signal included in the differential signal is eliminated by the HPF 14B. Therefore, the frequency characteristic of the differential N-path filter unit 14 and eventually the notch filter in FIG. 1 is the characteristic of the band elimination to eliminate the frequency component in the vicinity of the frequency $1/T_S$ being a central frequency.

Figure 5:
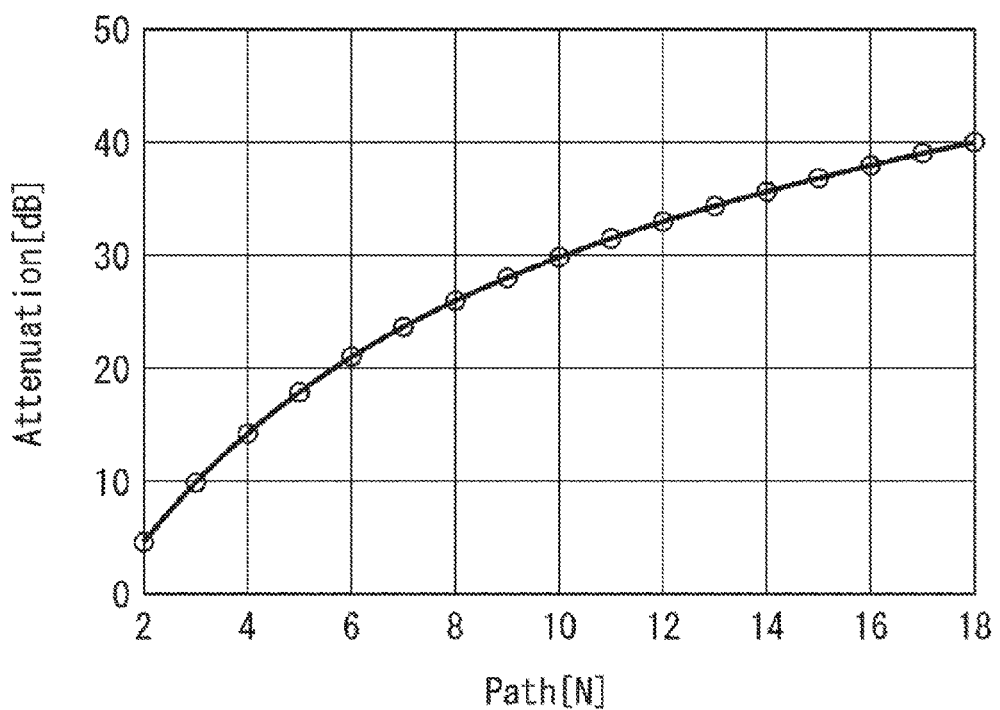
FIG. 5 is a view illustrating relationship between an attenuation amount ATT of the notch filter and the number of signal paths N of the differential N-path filter unit 14.

FIG. 5 is a view illustrating relationship between an attenuation amount ATT of the notch filter in FIG. 1 and the number of paths N of (the capacitor serving as) the signal path of the differential N-path filter unit 14.

Herein, in FIG. 5, the number of paths N and the attenuation amount ATT are plotted along the abscissa and ordinate, respectively.

The relationship between the attenuation amount ATT and the number of paths N in FIG. 5 is represented by expression (2).

[Mathematical Expression 2]

$$ATT[dB] = 20\log\left\{\frac{\pi^2}{\pi^2 - N^2\sin^2\left(\frac{\pi}{N}\right)}\right\} \quad (2)$$

According to FIG. 5, it is possible to realize the attenuation amount ATT of approximately 20 dB when N=6 and the attenuation amount ATT of approximately 25 dB when N=8, for example.

Also, according to FIG. 5, the number of paths N required is 18 for realizing the attenuation amount ATT of 40 dB, for example. Therefore, when the attenuation amount ATT of 40 dB is realized, the number of paths N three times as large as that when realizing the attenuation amount ATT of 20 dB is required.

Furthermore, in the differential N-path filter unit 14, as illustrated in FIG. 2, N-phase driving pulses phi having the pulse width tau equal to the period of the clock CLK, the period $T_S$ equal to N times the pulse width tau, and the pulse position shifted by the pulse width tau are generated by the ring counter 20.

Therefore, the clock CLK is required to be the clock having the frequency N (or more) times as high as the frequency $1/T_S$ of the driving pulse phi.

Also, in the differential N-path filter unit 14, the band the central frequency of which is the frequency $1/T_S$ is eliminated.

From above, for example, when a 13.56 MHz-signal (signal the central frequency of which is 13.56 MHz) of NFC is attenuated by the attenuation amount ATT of 40 dB, the clock having the frequency of 224.08 MHz 18 times as high as 13.56 MHz is required as the clock CLK.

Furthermore, 18 paths three times as many as those when N=6 are required as the number of paths N, and simply, a circuit scale of the notch filter is three times as large as that when N=6.

Since a receiver of BAN is embedded in a portable terminal, a wearable device and the like to be operated together with another circuit, it is requested that the frequency of the clock CLK is decreased as far as possible to realize low power consumption.

However, when a clock having a high frequency of 224.08 MHz is required as the clock CLK of the notch filter and the notch filter having a large circuit scale of 18 paths is required, it is difficult to realize the low power consumption.

Also, in the notch filter in FIG. 1, the central frequency (of the band) to be eliminated is fixed to 1/N of the frequency of the clock CLK. Therefore, when it is wanted that the frequency slightly away from 1/N of the frequency of the clock CLK is made the central frequency, the frequency of the clock CLK should be changed.

If the frequency of the clock CLK cannot be changed, for example, It is possible to change the central frequency only by a minute amount by arranging a variable frequency divider between the clock oscillator 17 and the ring counter 20 to increase/decrease the pulse width tau of the driving pulse phi by one clock.

However, when M+1 or M−1 frequency dividing is performed for increasing/decreasing the pulse width tau of the driving pulse phi in the variable frequency divider, the clock having a high frequency M times as high as that when the variable frequency divider is not arranged is required as the clock CLK. Furthermore, in the variable frequency divider, a control block (decoder) to control whether to perform the M+1 or M−1 dividing is also required.

Therefore, when the variable frequency divider is used to change the central frequency, the high-frequency clock CLK and the control block are required in addition to the variable frequency divider, so that large power is consumed.

Therefore, the present technology makes it possible that the notch filter easily obtains a desired frequency characteristic. That is to say, the present technology makes it easy to increase the attenuation amount of the notch filter and change the central frequency to a higher frequency (increase) or a lower frequency (decrease) without increasing the frequency of the clock CLK.

<First Embodiment of Notch Filter>

Figure 6:
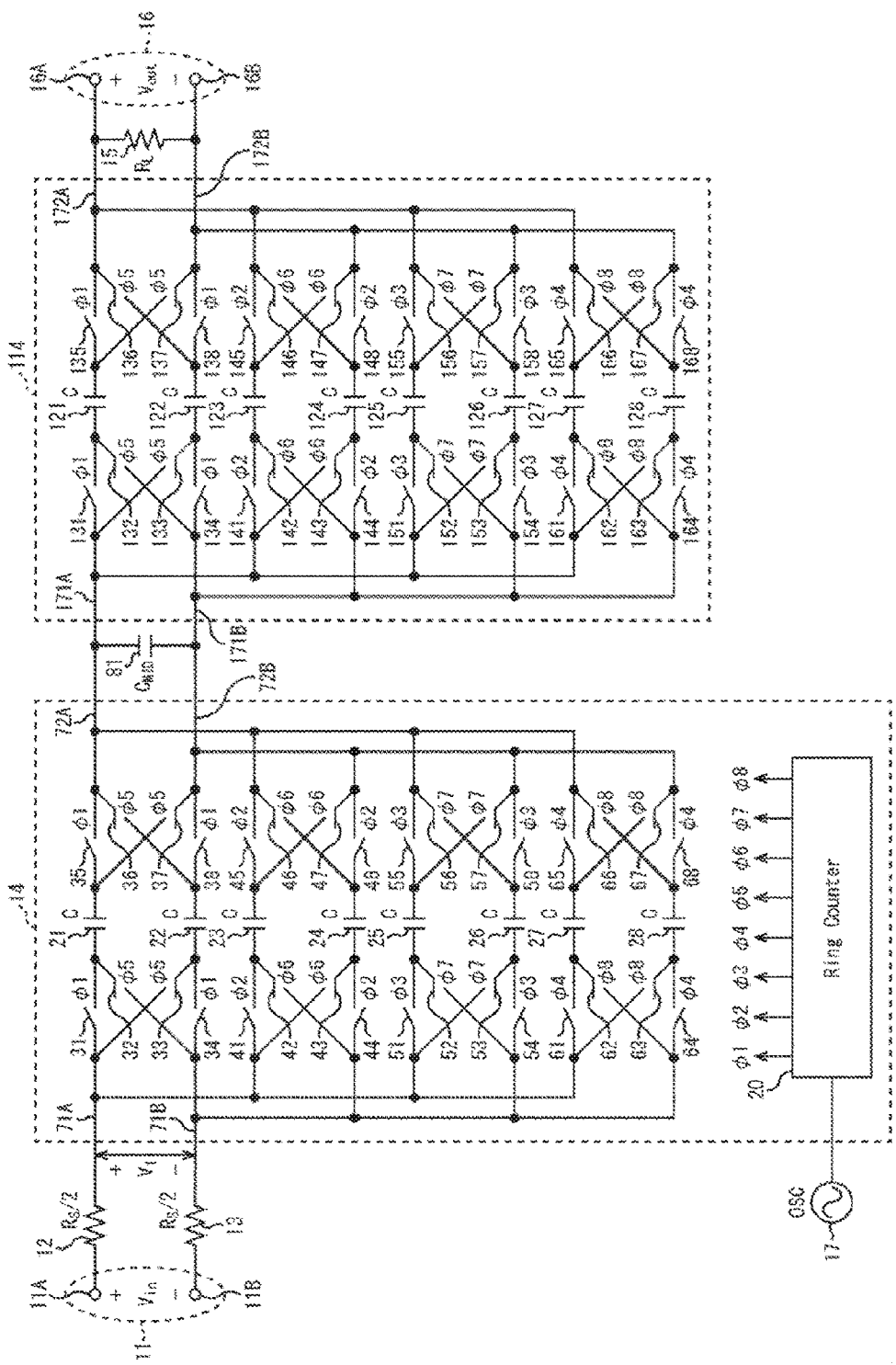
FIG. 6 is a block diagram illustrating a configuration example of a first embodiment of a notch filter to which the present technology is applied.

FIG. 6 is a block diagram illustrating a configuration example of a first embodiment of a notch filter to which the present technology is applied.

Meanwhile, in the drawing, a portion corresponding to that in FIG. 1 is assigned with the same reference sign, and description thereof is hereinafter appropriately omitted.

In FIG. 6, the notch filter includes a differential input terminal 11, resistances 12 and 13, a differential N-path filter unit 14, a resistance 15, a differential output terminal 16, a clock oscillator 17, a capacitor 81, and a differential N-path filter unit 114.

Therefore, the notch filter in FIG. 6 is the same as that in FIG. 1 in that components from the differential input terminal 11 to the clock oscillator 17 are included.

However, the notch filter in FIG. 6 is different from that in FIG. 1 in that the capacitor 81 and the differential N-path filter unit 114 are newly provided.

The differential N-path filter unit 114 is configured so as to be similar to the differential N-path filter unit 14 except that a block corresponding to a ring counter 20 is not provided.

Therefore, the differential N-path filter unit 114 filters a differential signal input thereto as is the case with the differential N-path filter unit 14 to output.

The differential N-path filter unit 114 includes capacitors 121 to 128, switches 131 to 138, 141 to 148, 151 to 158, and 161 to 168, a positive-phase signal input line 171A, a negative-phase signal input line 171B, a positive-phase signal output line 172A, and a negative-phase signal output line 172B.

Components from the capacitor 121 to the negative-phase signal output line 172B of the differential N-path filter unit 114 are configured so as to be similar to components from a capacitor 21 to a negative-phase signal output line 72B of the differential N-path filter unit 14, respectively.

Therefore, the switches 131 to 138, 141 to 148, 151 to 158, and 161 to 168 of the differential N-path filter unit 114 are turned on/off according to driving pulses phi in FIG. 2 output by the ring counter 20 as is the case with switches 31 to 38, 41 to 48, 51 to 58, and 61 to 68 of the differential N-path filter unit 14.

In FIG. 6, the differential N-path filter units 14 and 114 are cascade-connected (the differential N-path filter units 14 and 114 form cascade connection in two stages).

That is to say, a positive-phase signal output line 72A of the differential N-path filter unit 14 and the positive-phase signal input line 171A of the differential N-path filter unit 114 are connected to each other. Furthermore, the negative-phase signal output line 72B of the differential N-path filter unit 14 and the negative-phase signal input line 171B of the differential N-path filter unit 114 are connected to each other.

Also, in FIG. 6, the positive-phase signal output line 172A of the differential N-path filter unit 114 is connected to a positive-phase output terminal 16A to which one end of the resistance 15 is connected. Furthermore, the negative-phase signal output line 172B of the differential N-path filter unit 114 is connected to a negative-phase output terminal 16B to which the other end of the resistance 15 is connected.

Then, in FIG. 6, the capacitor 81 is inserted to a connection point of the differential N-path filter units 14 and 114 as interstage capacitance inserted between the differential N-path filter units 14 and 114.

That is to say, the capacitor 81 is inserted between a connection point of the positive-phase signal output line 72A of the differential N-path filter unit 14 and the positive-phase signal input line 171A of the differential N-path filter unit 114 on a next stage and a connection point of the negative-phase signal output line 72B of the differential N-path filter unit 14 and the negative-phase signal input line 171B of the differential N-path filter unit 114 on the next stage.

In the notch filter configured in the above-described manner, the differential signal formed of a positive-phase signal input from a positive-phase input terminal 11A to the positive-phase signal input line 71A through the resistance 12 and a negative-phase signal input from a negative-phase input terminal 11B to the negative-phase signal input line 71B through the resistance 13 is filtered by the differential N-path filter unit 14.

The positive-phase signal out of the differential signal filtered by the differential N-path filter unit 14 is output from the positive-phase signal output line 72A to be input to the positive-phase signal input line 171A of the differential N-path filter unit 114. Also, the negative-phase signal out of the differential signal filtered by the differential N-path filter unit 14 is output from the negative-phase signal output line 72B to be input to the negative-phase signal input line 171B of the differential N-path filter unit 114.

The differential signal formed of the positive-phase signal input to the positive-phase signal input line 171A and the negative-phase signal input to the negative-phase signal input line 171B is filtered by the differential N-path filter 114.

Then, the positive-phase signal out of the filtered differential signal is output from the positive-phase signal output line 172A to be supplied to the positive-phase output terminal 16A. Furthermore, the negative-phase signal out of the filtered differential signal is output from the negative-phase signal output line 172B to be supplied to the negative-phase output terminal 16B.

Hereinafter, a characteristic of the notch filter in FIG. 6 when a frequency $N/T_S$ of a clock CLK is set to 108.48 MHz (=8×13.56 MHz), a resistance value $R_S/2$ of the resistances 12 and 13 is set to 5 kΩ, a resistance value $R_L$ of the resistance 15 is set to 10 kΩ, capacitance C of the capacitors 21 to 28 and 121 to 128 is set to 4 pF is described.

Figure 7:
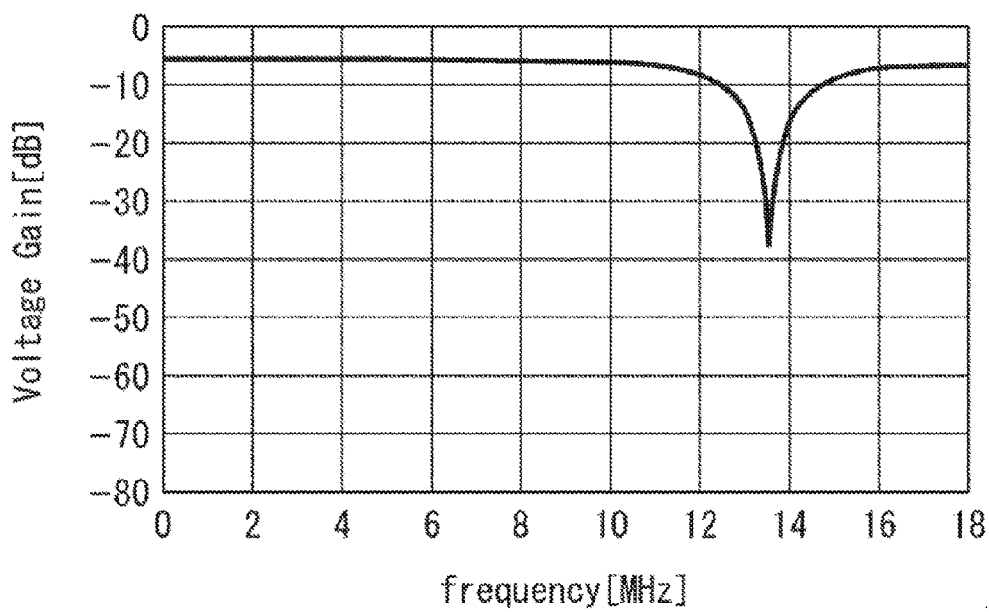
FIG. 7 is a view illustrating a frequency characteristic of the notch filter in which a capacitor 81 is not provided.

FIG. 7 is a view illustrating a frequency characteristic of the notch filter in FIG. 6 in which the capacitor 81 is not provided.

When the capacitor 81 is not provided, the frequency characteristic of the notch filter in FIG. 6 is the characteristic of band elimination with an attenuation amount of approximately 26 dB at a frequency of 13.56 MHz.

Therefore, as illustrated in FIG. 6, although the differential N-path filter units 14 and 114 are cascade-connected in two stages, when the capacitor 81 is not provided, the frequency characteristic is substantially the same as the frequency characteristic of the notch filter provided with only one stage of the differential N-path filter unit 14 illustrated in FIG. 3.

That is to say, although the differential N-path filter units 14 and 114 are cascade-connected in two stages, if the capacitor 81 is not provided, there is scarcely an effect of the two stages.

Figure 8:
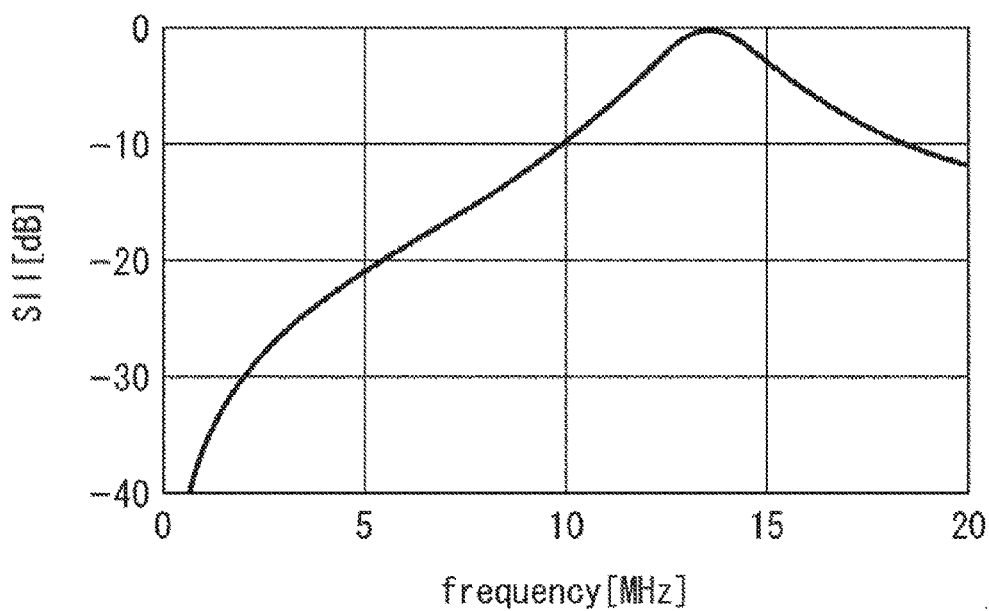
FIG. 8 is a view illustrating an input reflection coefficient (S parameter) S11 of the notch filter in which the capacitor 81 is not provided.

FIG. 8 is a view illustrating an input reflection coefficient (S parameter) S11 of the notch filter in FIG. 6 in which the capacitor 81 is not provided.

The input reflection coefficient S11 in FIG. 8 may be obtained according to expression (3) when voltage between the positive-phase input terminal 11A and the negative-phase input terminal 11B is set to Vin and voltage between the positive-phase signal input line 71A and the negative-phase signal input line 71B is set to $V_1$.

[Mathematical Expression 3]

$$S11[dB] = 20\log\left(2\frac{V_1}{V_{in}} - 1\right) \tag{3}$$

According to FIG. 8, the input reflection coefficient S11 of the notch filter in FIG. 6 in which the capacitor 81 is not provided is approximately −10 dB for the differential signal Vin of 10 MHz, so that it is hard to say that impedance matching is excellent.

Figure 9:
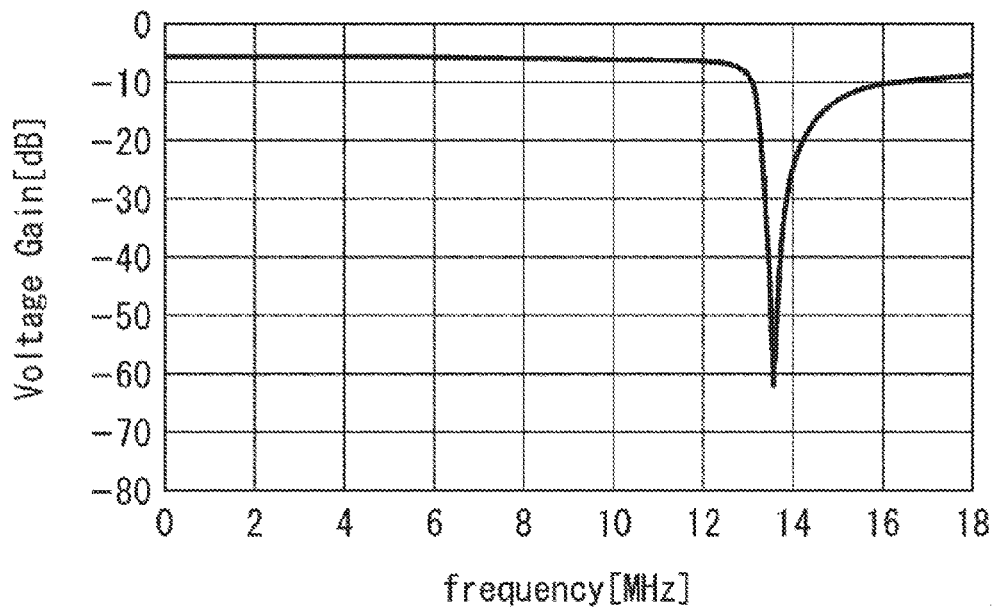
FIG. 9 is a view illustrating the frequency characteristic of the notch filter in which the capacitor 81 is provided.

FIG. 9 is a view illustrating the frequency characteristic of the notch filter in FIG. 6 in which the capacitor 81 is provided.

When the capacitor 81 is provided, the frequency characteristic of the notch filter in FIG. 6 is the characteristic of the band, elimination with the attenuation amount of approximately 55 dB at the frequency of 13.56 MHz.

Therefore, when the capacitor 81 is provided, the attenuation amount at the frequency of 13.56 MHz is approximately twice as much as that when the capacitor 81 is not provided or more.

Figure 10:
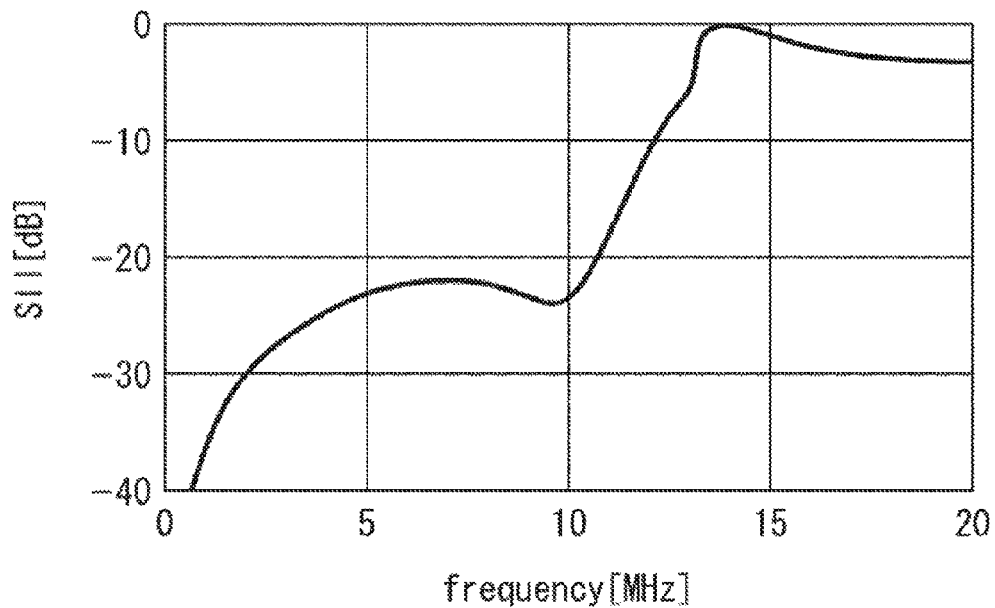
FIG. 10 is a view illustrating the input reflection coefficient S11 of the notch filter in which the capacitor 81 is provided.

FIG. 10 is a view illustrating the input reflection coefficient S11 of the notch filter in FIG. 6 in which the capacitor 81 is provided.

According to FIG. 10, the input reflection coefficient S11 of the notch filter in FIG. 6 in which the capacitor 81 is provided is approximately −23 dB for the differential signal Vin of 10 MHz, so that the impedance matching is excellent.

As described above, it is possible to improve the impedance matching by obtaining the cascade connection in two stages of the differential N-path filter units 14 and 114 and providing the capacitor 81 between the differential N-path filter units 14 and 114. As a result, it becomes possible to decrease the input reflection coefficient S11 of the notch filter and significantly increase the attenuation amount of the notch filter.

Also, it is not required to increase the number of paths N for each of the cascade-connected differential N-path filter units 14 and 114 when significantly increasing the attenuation amount of the notch filter. Therefore, it is possible to significantly increase the attenuation amount of the notch filter without increasing the circuit scale of each of the differential N-path filter units 14 and 114 and without increasing the frequency of the clock CLK.

<Second Embodiment of Notch Filter>

Figure 11:
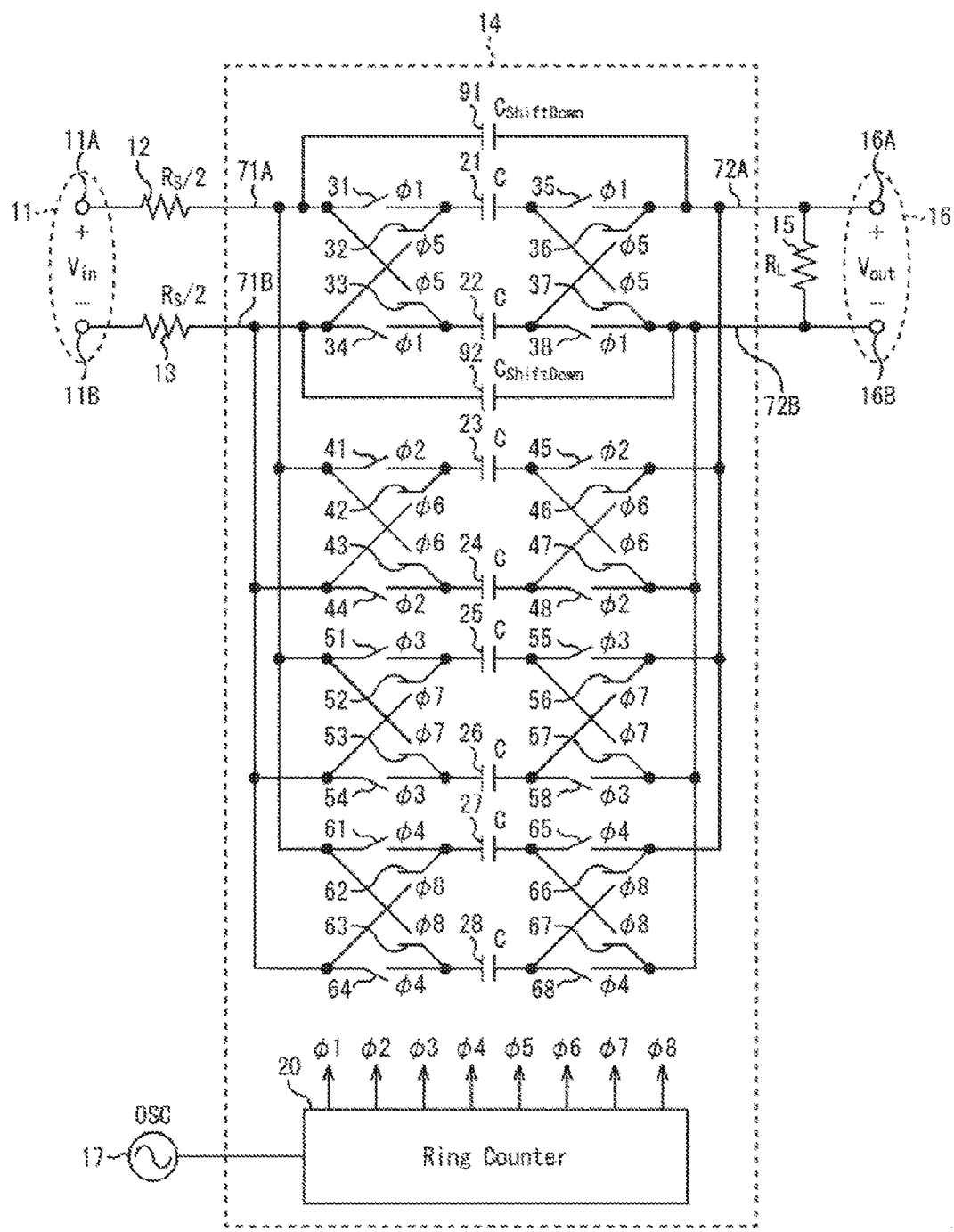
FIG. 11 is a block diagram illustrating a configuration example of a second embodiment of a notch filter to which the present technology is applied.

FIG. 11 is a block diagram illustrating a configuration example of a second embodiment of a notch filter to which the present technology is applied.

Meanwhile, in the drawing, a portion corresponding to that in FIG. 1 is assigned with the same reference sign, and description thereof is hereinafter appropriately omitted.

In FIG. 11, the notch filter includes components from a differential input terminal 11 to a clock oscillator 17.

Therefore, the notch filter in FIG. 11 is the same as that in FIG. 1 in that the components from the differential input terminal 11 to the clock oscillator 17 are included.

Furthermore, the notch filter in FIG. 11 is the same as that in FIG. 1 in that the N-path filter unit 14 includes a ring counter 20, capacitors 21 to 28, and switches 31 to 38, 41 to 48, 51 to 58, and 61 to 68.

However, the notch filter in FIG. 11 is different from that in FIG. 1 in that capacitors 91 and 92 are newly provided in the N-path filter unit 14.

The capacitor 91 is inserted between a positive-phase signal input line 71A and a positive-phase signal output line 72A as frequency shift capacitance to shift a central frequency of the notch filter.

That is to say, one end of the capacitor 91 is connected to the positive-phase signal input line 71A and the other end of the capacitor 91 is connected to the positive-phase signal output line 72A. According to this, the capacitor 91 connects the positive-phase signal input line 71A to the positive-phase signal output line 72A (as a positive-phase connection capacitor).

The capacitor 92 is inserted between a negative-phase signal input line 71B and a negative-phase signal output line 72B as frequency shift capacitance.

That is to say, one end of the capacitor 92 is connected to the negative-phase signal input line 71B and the other end of the capacitor 92 is connected to the negative-phase signal output line 72B. According to this, the capacitor 92 connects the negative-phase signal input line 71B to the negative-phase signal output line 72B (as a negative-phase connection capacitor).

Hereinafter, a characteristic of the notch filter in FIG. 11 when a frequency $N/T_S$ of a clock CLK is set to 108.48 MHz (=8×13.56 MHz), a resistance value $R_S/2$ of the resistances 12 and 13 is set to 5 kΩ, a resistance value $R_L$ of the resistance 15 is set to 10 kΩ, and capacitance C of the capacitors 21 to 28 is set to 4 pF is described.

Figure 12:
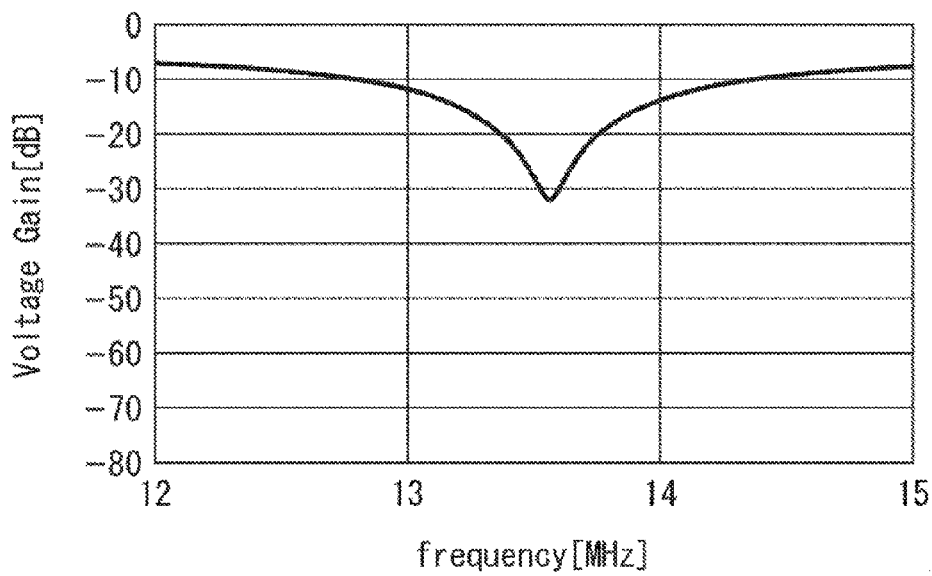
FIG. 12 is a view illustrating a frequency characteristic of the notch filter in which capacitors 91 and 92 are not provided.

FIG. 12 is a view illustrating a frequency characteristic of the notch filter in FIG. 11 in which the capacitors 91 and 92 are not provided.

When the capacitors 91 and 92 are not provided, the frequency characteristic of the notch filter in FIG. 11 is the characteristic of band elimination with the central frequency of 13.56 MHz.

Figure 13:
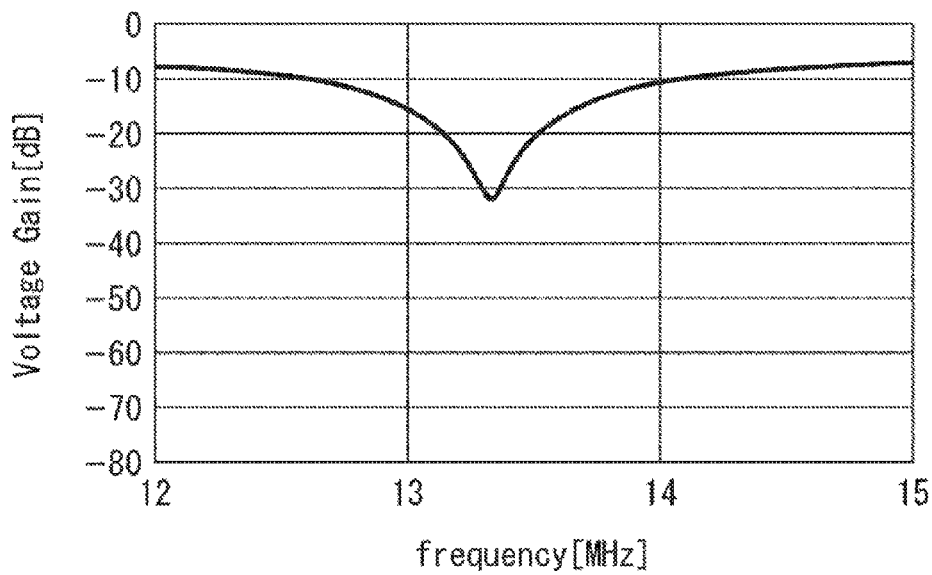
FIG. 13 is a view illustrating the frequency characteristic of the notch filter in which the capacitors 91 and 92 are provided.

FIG. 13 is a view illustrating the frequency-characteristic of the notch filter in FIG. 11 in which the capacitors 91 and 92 are provided.

Meanwhile, in FIG. 13, 300 fF is adopted as capacitance $C_{ShiftDown}$ of the capacitors 91 and 92.

According to FIG. 13, the central frequency of the notch filter is 13.33 MHz.

Therefore, it is possible to decrease (shift downward) the central frequency of the notch filter from 13.56 MHz to 13.33 MHz by providing the capacitors 91 and 92.

That is to say, providing the capacitor 91 which connects the positive-phase signal input line 71A to the positive-phase signal output line 72A and the capacitor 92 which connects the negative-phase signal input line 71B to the negative-phase signal output line 72B makes it possible to shift the central frequency downward without changing the frequency of the clock CLK.

<Third Embodiment of Notch Filter>

Figure 14:
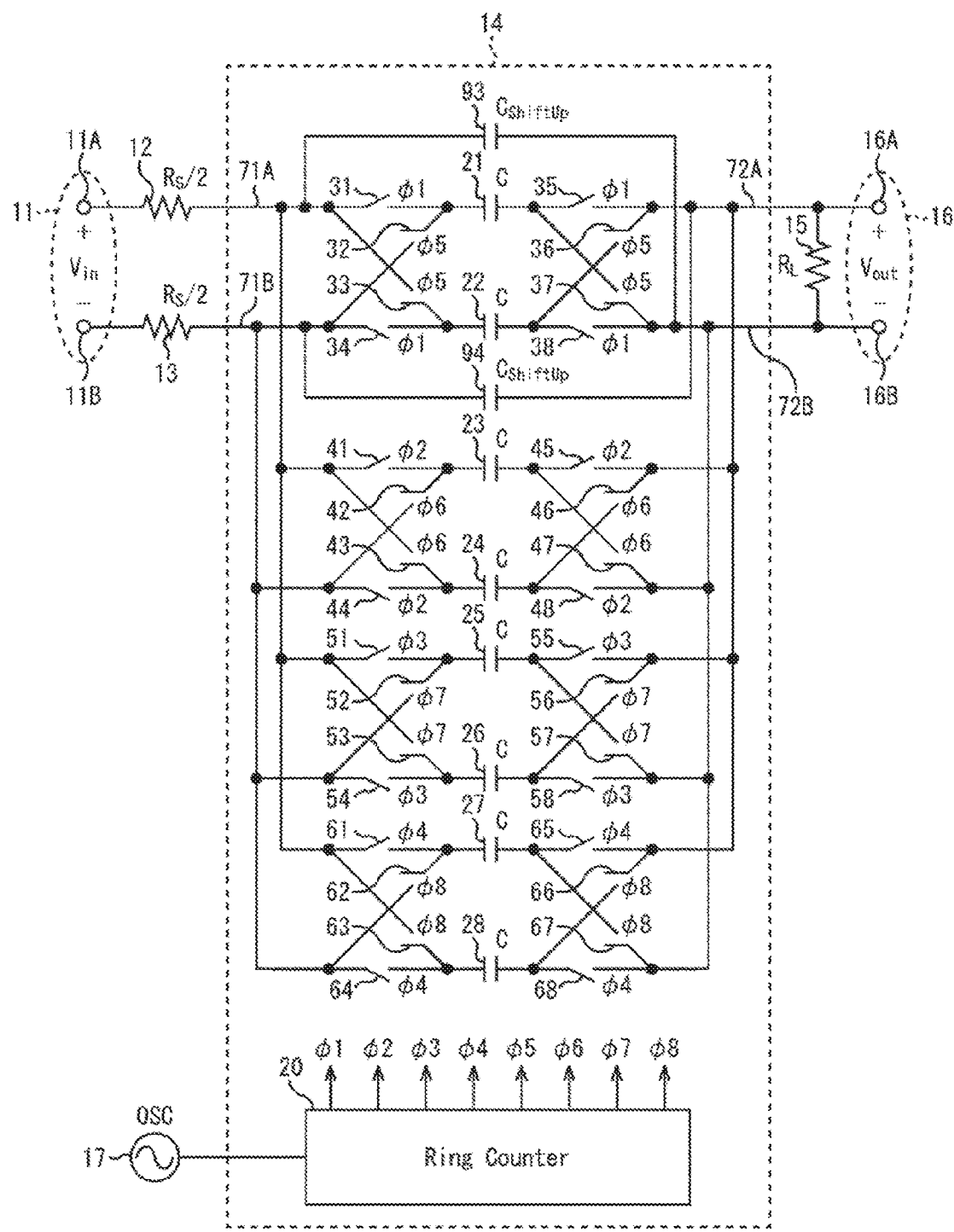
FIG. 14 is a block diagram illustrating a configuration example of a third embodiment of a notch filter to which the present technology is applied.

FIG. 14 is a block diagram illustrating a configuration example of a third embodiment of a notch filter to which the present technology is applied.

Meanwhile, in the drawing, a portion corresponding to that in FIG. 1 is assigned with the same reference sign, and description thereof is hereinafter appropriately omitted.

In FIG. 14, the notch filter includes components from a differential input terminal 11 to a clock oscillator 17.

Therefore, the notch filter in FIG. 14 is the same as that in FIG. 1 in that the components from the differential input terminal 11 to the clock oscillator 17 are included.

Furthermore, the notch filter in FIG. 14 is the same as that in FIG. 1 in that the N-path filter unit 14 includes a ring counter 20, capacitors 21 to 28, and switches 31 to 38, 41 to 48, 51 to 58, and 61 to 68.

However, the notch filter in FIG. 14 is different from that in FIG. 1 in that capacitors 93 and 94 are newly provided in the N-path filter unit 14.

The capacitor 93 is inserted between a positive-phase signal input line 71A and a negative-phase signal output line 72B as frequency shift capacitance.

That is to say, one end of the capacitor 93 is connected to the positive-phase signal input line 71A and the other end of the capacitor 93 is connected to the negative-phase signal output line 72B. According to this, the capacitor 93 connects the positive-phase signal input line 71A to the negative-phase signal output line 72B (as a positive-phase connection capacitor).

The capacitor 94 is inserted between a negative-phase signal input line 71B and a positive-phase signal output line 72A as frequency shift capacitance.

That is to say, one end of the capacitor 94 is connected to the negative-phase signal input line 71B and the other end of the capacitor 94 is connected to the positive-phase signal output line 72A. According to this, the capacitor 94 connects the negative-phase signal input line 71B to the positive-phase signal output line 72A (as a negative-phase connection capacitor).

Hereinafter, a characteristic of the notch filter in FIG. 14 when a frequency $N/T_S$ of a clock CLK is set to 108.48 MHz (=8×13.56 MHz), a resistance value $R_S/2$ of the resistances 12 and 13 is set to 5 kΩ, a resistance value $R_L$ of the resistance 15 is set to 10 kΩ, and capacitance C of the capacitors 21 to 28 is set to 4 pF is described.

The frequency characteristic of the notch filter in FIG. 14 in which the capacitors 93 and 94 are not provided is the characteristic of band elimination with a central frequency of 13.56 MHz as illustrated in FIG. 12.

Figure 15:
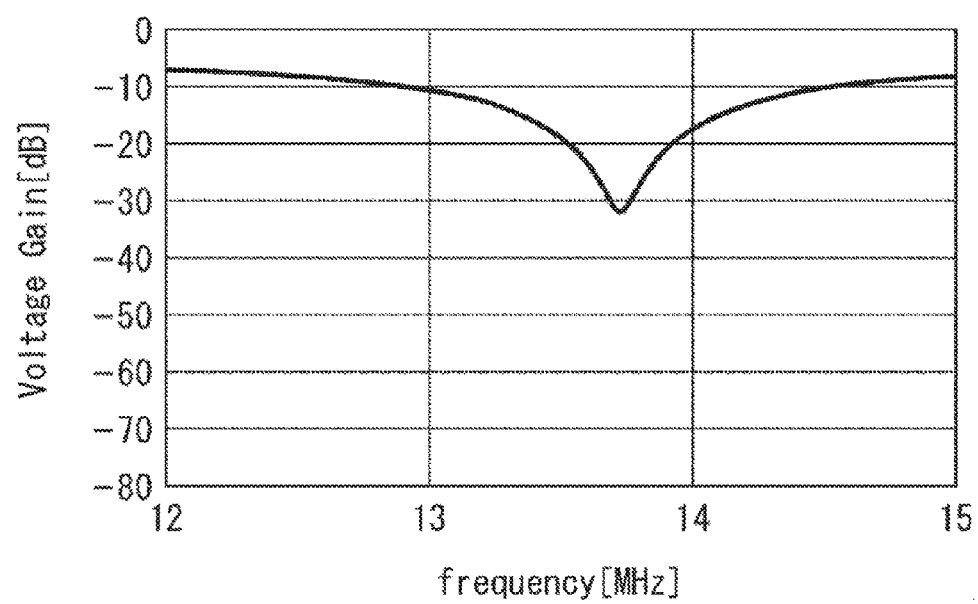
FIG. 15 is a view illustrating the frequency characteristic of the notch filter in which capacitors 93 and 94 are provided.

FIG. 15 is a view illustrating the frequency characteristic of the notch filter in FIG. 14 in which the capacitors 93 and 94 are provided.

Meanwhile, in FIG. 15, 200 fF is adopted as capacitance $C_{ShiftUp}$ of the capacitors 93 and 94.

According to FIG. 15, the central frequency of the notch filter is 13.73 MHz.

Therefore, it is possible to increase (shift upward) the central frequency of the notch filter from 13.56 MHz to 13.73 MHz by providing the capacitors 93 and 94.

That is to say, providing the capacitor 93 which connects the positive-phase signal input line 71A to the negative-phase signal output line 72B and the capacitor 94 which connects the negative-phase signal input line 71B to the positive-phase signal output line 72A makes it possible to shift the central frequency upward without changing the frequency of the clock CLK.

<Fourth Embodiment of Notch Filter>

Figure 16:
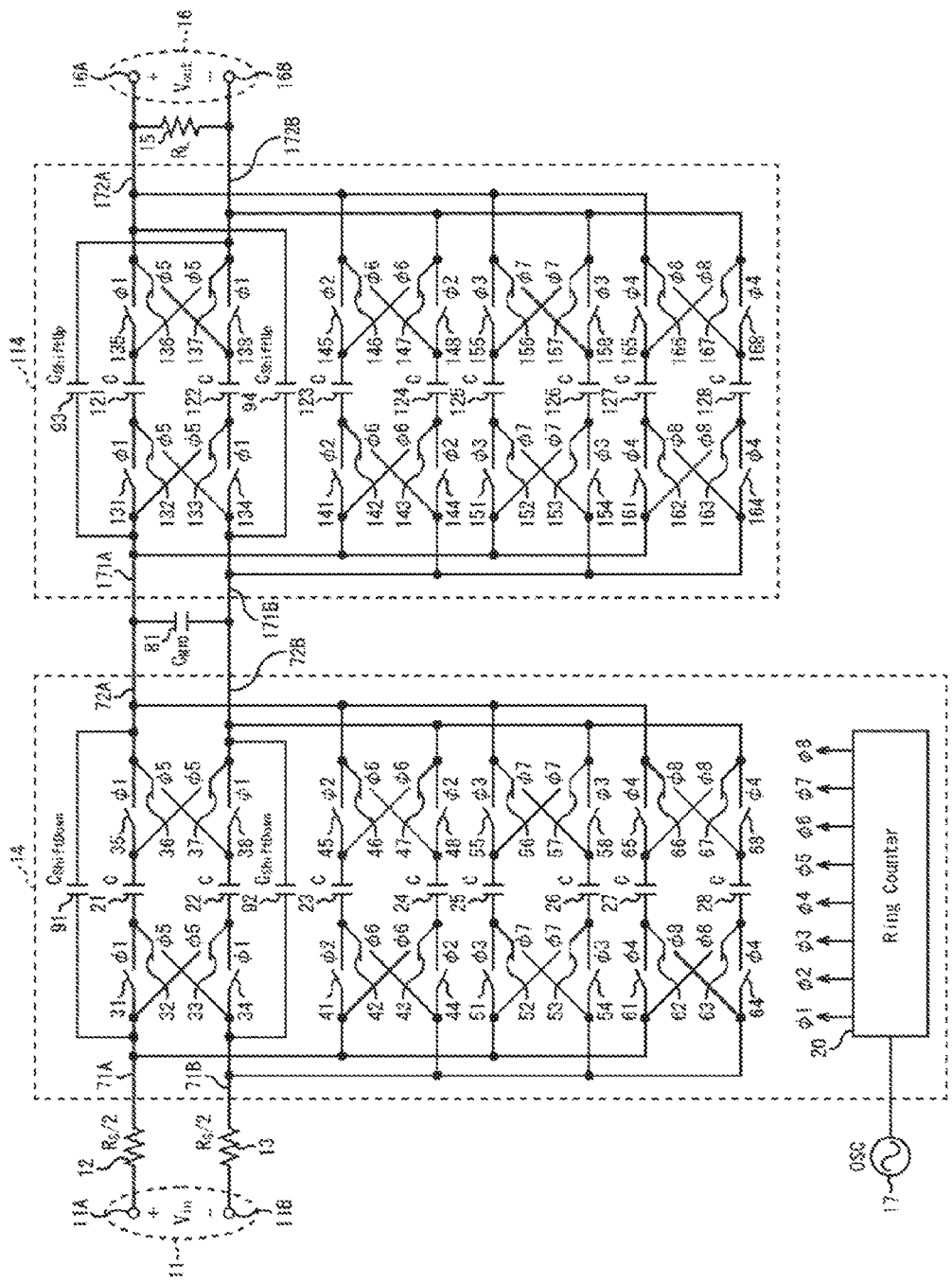
FIG. 16 is a block diagram illustrating a configuration example of a fourth embodiment of a notch filter to which the present technology is applied.

FIG. 16 is a block diagram illustrating a configuration example of a fourth embodiment of a notch filter to which the present technology is applied.

Meanwhile, in the drawing, a portion corresponding to that in FIGS. 6, 11, and 14 is assigned with the same reference sign, and description thereof is hereinafter appropriately omitted.

In FIG. 16, the notch filter includes components from a differential input terminal 11 to a clock oscillator 17, a capacitor 81, and a differential N-path filter unit 114.

Therefore, the notch filter in FIG. 16 is the same as that in FIG. 6 in that the components from the differential input terminal 11 to the clock oscillator 17, the capacitor 81, and the differential N-path filter unit 114 are included.

Furthermore, the notch filter in FIG. 16 is the same as that in FIG. 6 in that the N-path filter unit 14 includes a ring counter 20, capacitors 21 to 28, and switches 31 to 38, 41 to 48, 51 to 58, and 61 to 68.

However, the notch filter in FIG. 16 is different from that in FIG. 6 in that capacitors 91 and 92 in FIG. 11 are newly provided in the N-path filter unit 14.

Also, the notch filter in FIG. 16 is the same as that in FIG. 6 in that the N-path filter unit 114 includes capacitors 121 to 128, and switches 131 to 138, 141 to 148, 151 to 158, and 161 to 168.

However, the notch filter in FIG. 16 is different from that in FIG. 6 in that capacitors 93 and 94 in FIG. 14 are newly provided in the N-path filter unit 114.

As described above, in FIG. 16, the capacitors 93 and 94 are provided not in the N-path filter unit 14 but in the N-path filter unit 114.

That is to say, the capacitor 93 is inserted between a positive-phase signal input line 71A and a negative-phase signal output line 72B as frequency shift capacitance.

Specifically, one end of the capacitor 93 is connected to a positive-phase signal input line 171A and the other end of the capacitor 93 is connected to a negative-phase signal output line 172B. According to this, the capacitor 93 connects the positive-phase signal input line 171A to the negative-phase signal output line 172B (as a positive-phase/negative-phase connection capacitor).

Also, the capacitor 94 is inserted between a negative-phase signal input line 171B and a positive-phase signal output line 172A as frequency shift capacitance.

Specifically, one end of the capacitor 94 is connected to the negative-phase signal input line 171B and the other end of the capacitor 94 is connected to the positive-phase signal output line 172A. According to this, the capacitor 94 connects the negative-phase signal input line 171B to the positive-phase signal output line 172A (as a negative-phase connection capacitor).

Hereinafter, a characteristic of the notch filter in FIG. 16 when a frequency $N/T_S$ of a clock CLK is set to 108.48 MHz (=8×13.56 MHz), a resistance value $R_S/2$ of the resistances 12 and 13 is set to 5 kΩ, a resistance value $R_L$ of the resistance 15 is set to 10 kΩ, and capacitance C of the capacitors 21 to 28 and 121 to 128 is set to 4 pF is described.

Figure 17:
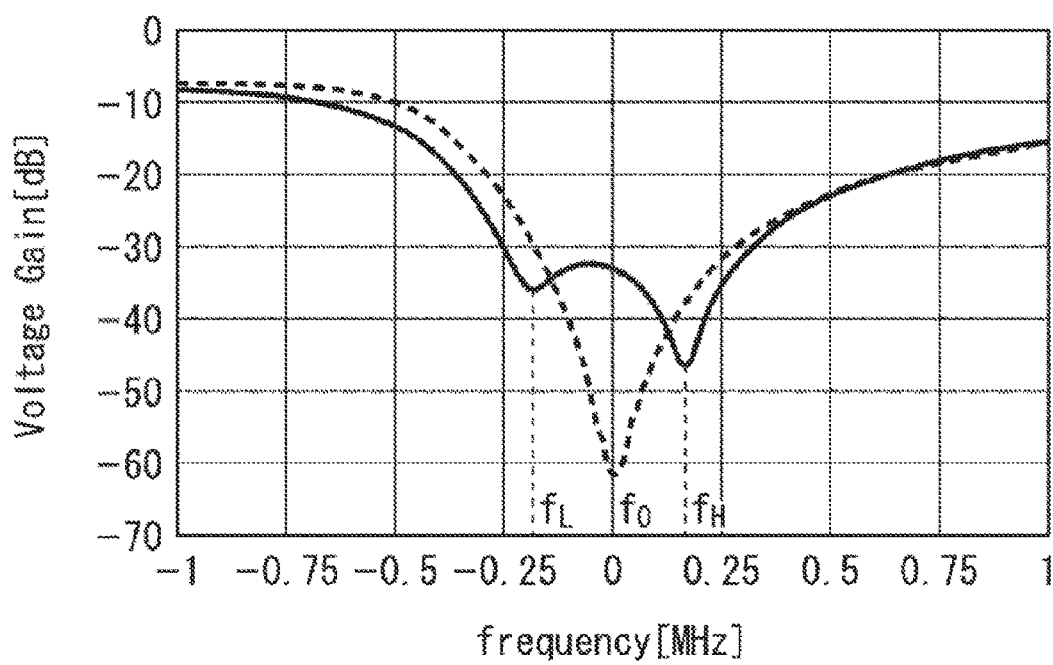
FIG. 17 is a view illustrating a frequency characteristic of the notch filter in which capacitors 91 to 94 are provided.

FIG. 17 is a view illustrating a frequency characteristic of the notch filter in FIG. 16 in which the capacitors 91 to 94 are provided.

Meanwhile, in FIG. 17, 250 fF is adopted as capacitance $C_{ShiftDown}$ of the capacitors 91 and 92 and 400 fF is adopted as capacitance $C_{ShiftUp}$ of the capacitors 93 and 94.

In FIG. 17, dotted line indicates the frequency characteristic of the notch filter in FIG. 16 in which the capacitors 91 to 94 are not provided, and solid line indicates the frequency characteristic of the notch filter in FIG. 16 in which the capacitors 91 to 94 are provided.

According to FIG. 17, providing the capacitors 91 to 94 may enlarge a bandwidth of a frequency to be attenuated as compared to a case in which the capacitors 91 to 94 are not provided.

Meanwhile, in FIG. 17, there is a peak of an attenuation amount at a frequency $f_L$ slightly lower than a central frequency $f_0$ and at a frequency $f_H$ slightly higher than the central frequency on the basis of the central frequency $f_0$ of the notch filter in FIG. 16 in which the capacitors 91 to 94 are not provided.

The peak at the frequency $f_L$ is the peak formed by downward shift of the peak at the frequency $f_0$ by the capacitors 91 and 92. Also, the peak at the frequency $f_H$ is the peak formed by upward shift of the peak at the frequency $f_0$ by the capacitors 93 and 94.

As described above, according to the capacitors 91 and 92 and the capacitors 93 and 94, it is possible to change the central frequency of the notch filter within a minute range or enlarge a bandwidth of the frequency to be attenuated without changing the frequency of the clock CLK and without providing the variable frequency divider.

Meanwhile, although the differential N-path filter unit 14 including the capacitors 91 and 92 is the N-path filter on a first stage and the differential N-path filter unit 114 including the capacitors 93 and 94 is the N-path filter on a second stage in FIG. 16, it is also possible to change the order of the differential N-path filters 14 and 114 in cascade connection in two stages.

That is to say, the differential N-path filter unit 114 may be made the N-path filter on the first stage and the differential N-path filter unit 14 may be made the N-path filter on the second stage.

Also, although the capacitor 81 is provided on a connection point of the differential N-path filters 14 and 114 in FIG. 16, it is also possible to form the notch filter in FIG. 16 without the capacitor 81.

When the notch filter in FIG. 16 is formed without the capacitor 81, the frequency characteristic of the notch filter is the characteristic in which the peak of the attenuation amount is located at each of the frequencies $f_L$ and $f_H$ as is the case with FIG. 17. However, the attenuation amount becomes smaller than that when there is the capacitor 81.

<Fifth Embodiment of Notch Filter>

Figure 18:
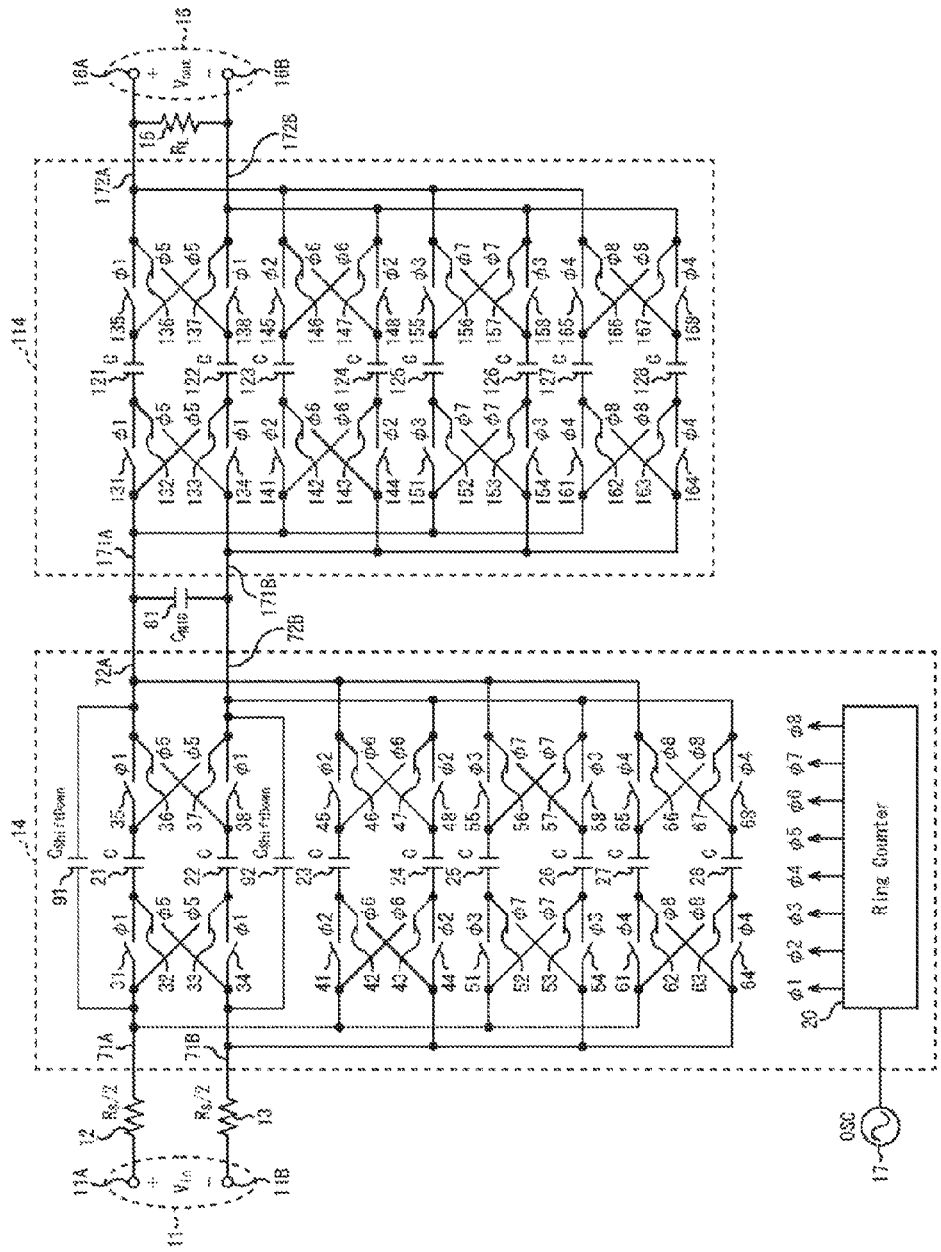
FIG. 18 is a block diagram, illustrating a configuration example of a fifth embodiment of a notch filter to which the present technology is applied.

FIG. 18 is a block diagram illustrating a configuration example of a fifth embodiment of a notch filter to which the present technology is applied.

Meanwhile, in the drawing, a portion corresponding to that in FIG. 16 is assigned with the same reference sign, and description thereof is hereinafter appropriately omitted.

In FIG. 18, the notch filter is the same as that in FIG. 16 in that components from a differential input terminal 11 to a clock oscillator 17, a capacitor 81, and a differential N-path filter unit 114 are included.

However, the notch filter in FIG. 18 is different from that in FIG. 16 in that capacitors 93 and 94 are not provided in the N-path filter unit 114.

Herein, as illustrated in FIG. 17, in a frequency characteristic of the notch filter in FIG. 16, a peak at a frequency $f_L$ is the peak formed by downward shift of the peak at a frequency $f_0$ by the capacitors 91 and 92. Also, the peak at the frequency $f_H$ is the peak formed by upward shift of the peak at the frequency $f_0$ by the capacitors 93 and 94.

Since the capacitors 93 and 94 forming the peak at the frequency $f_H$ are not provided in the notch filter in FIG. 18, the frequency characteristic thereof is the characteristic in which the peak of an attenuation amount is located at each of the frequencies $f_0$ and $f_L$.

Meanwhile, magnitude of the peak, that is to say, the attenuation amount at the frequency $f_0$ becomes slightly smaller than that of the frequency characteristic of the notch filter in which the capacitors 91 to 94 are not provided (frequency characteristic indicated by dotted line in FIG. 17) (depth of the peak becomes shallower).

<Sixth Embodiment of Notch Filter>

Figure 19:
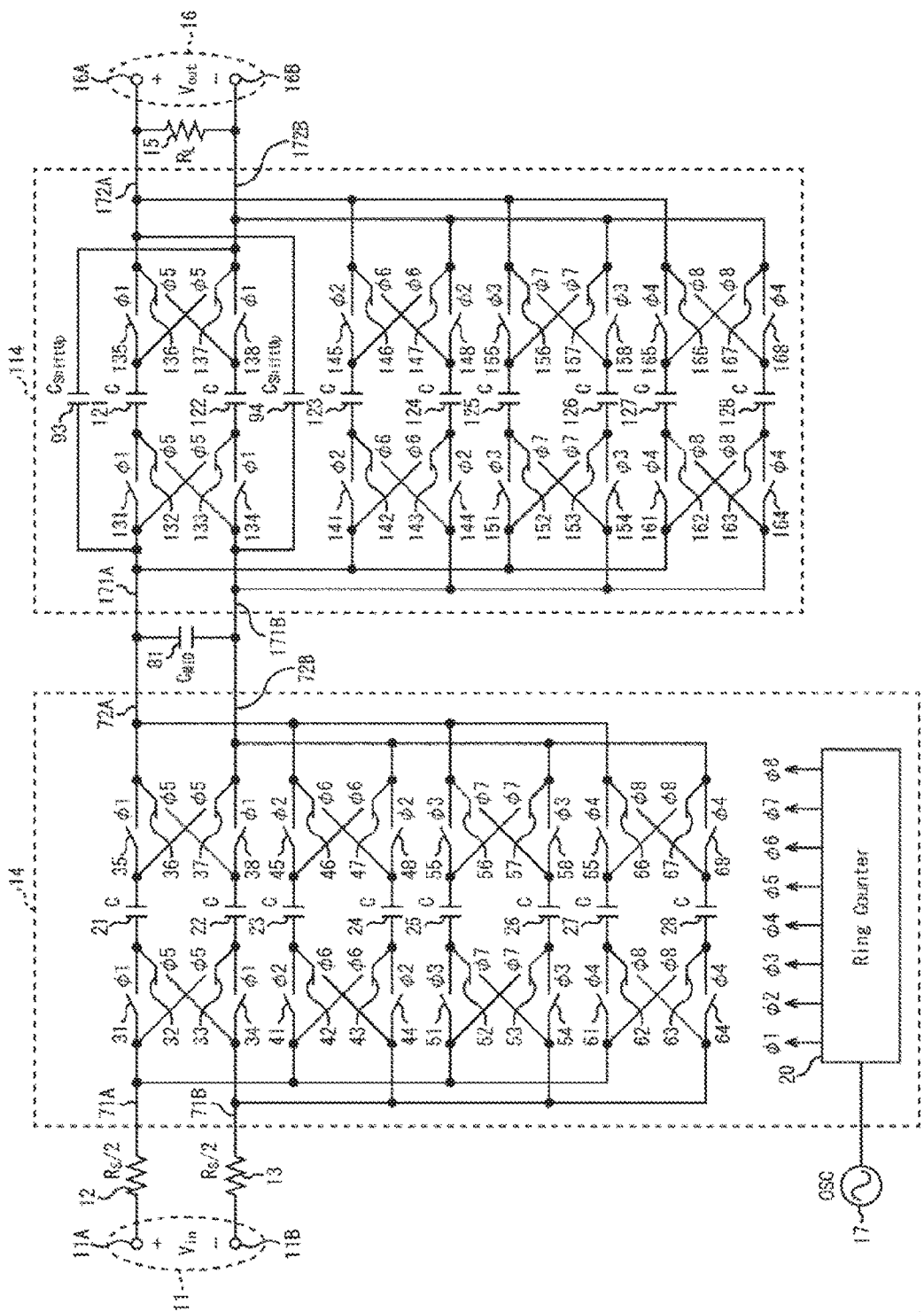
FIG. 19 is a block diagram illustrating a configuration example of a sixth embodiment of a notch filter to which the present technology is applied.

FIG. 19 is a block diagram illustrating a configuration example of a sixth embodiment of a notch filter to which the present technology is applied.

Meanwhile, in the drawing, a portion corresponding to that in FIG. 16 is assigned with the same reference sign, and description thereof is hereinafter appropriately omitted.

In FIG. 19, the notch filter is the same as that in FIG. 16 in that components from a differential input terminal 11 to a clock oscillator 17, a capacitor 81, and a differential N-path filter unit 114 are included.

However, the notch filter in FIG. 19 is different from that in FIG. 16 in that capacitors 91 and 92 are not provided in the N-path filter unit 14.

Herein, as illustrated in FIG. 17, in a frequency characteristic of the notch filter in FIG. 16, a peak at a frequency $f_L$ is the peak formed by downward shift, of the peak at a frequency $f_0$ by the capacitors 91 and 92. Also, the peak at the frequency $f_H$ is the peak formed by upward shift of the peak at the frequency $f_0$ by the capacitors 93 and 94.

Since the capacitors 91 and 92 forming the peak at the frequency $f_L$ are not provided in the notch filter in FIG. 19, a frequency characteristic thereof is the characteristic in which the peak of an attenuation amount is located, at each of the frequencies $f_0$ and $f_H$.

Meanwhile, magnitude of the peak, that is to say, the attenuation amount at the frequency $f_0$ becomes slightly smaller than that of the frequency characteristic of the notch filter in which the capacitors 91 to 94 are not provided (frequency characteristic indicated by dotted line in FIG. 17).

<Seventh Embodiment of Notch Filter>

Figure 20:
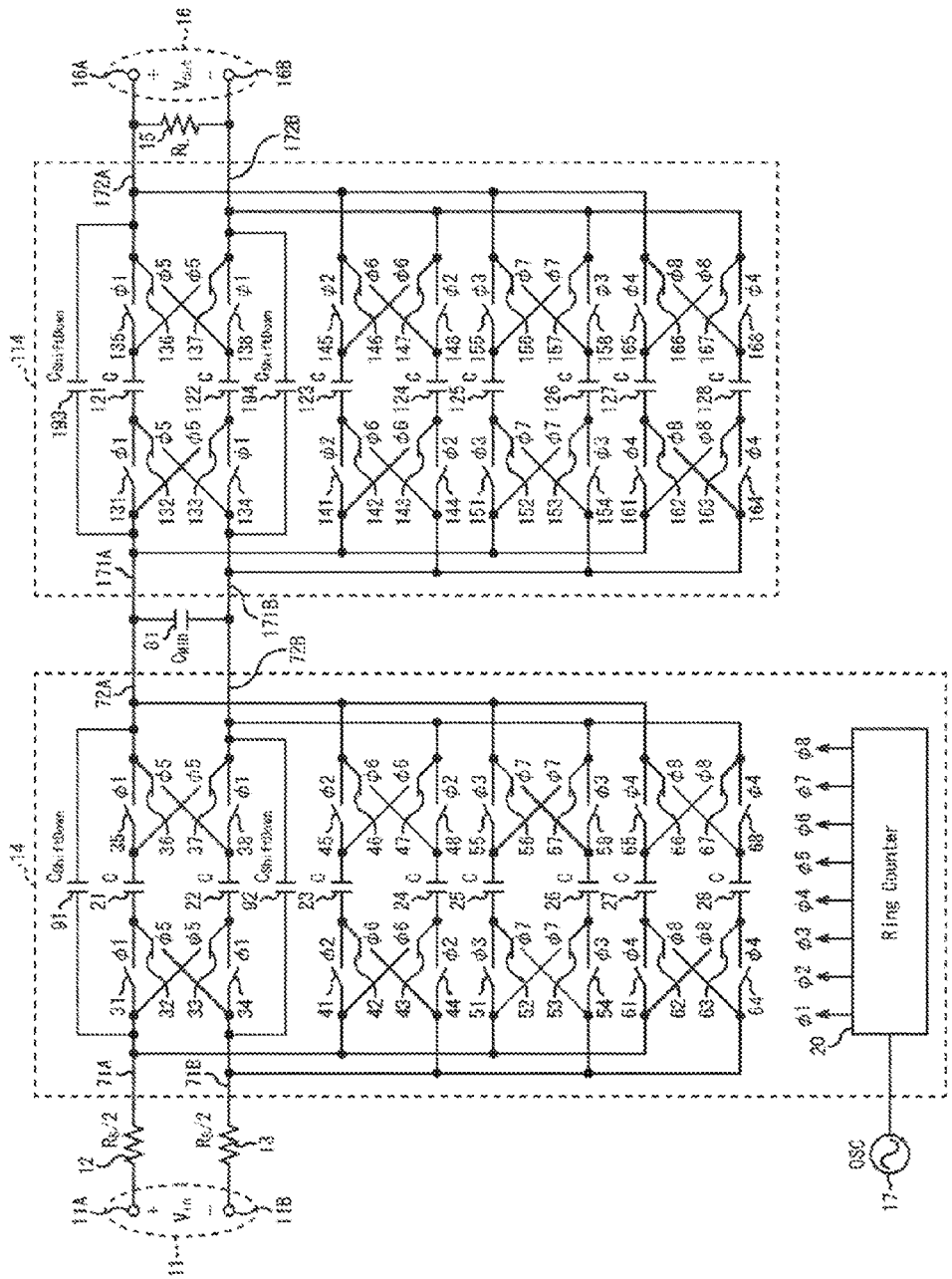
FIG. 20 is a block diagram illustrating a configuration example of a seventh embodiment of a notch filter to which the present technology is applied.

FIG. 20 is a block diagram illustrating a configuration example of a seventh embodiment of a notch filter to which the present technology is applied.

Meanwhile, in the drawing, a portion corresponding to that in FIG. 16 is assigned with the same reference sign, and description thereof is hereinafter appropriately omitted.

In FIG. 20, the notch filter is the same as that in FIG. 16 in that components from a differential input terminal 11 to a clock oscillator 17, a capacitor 81, and a differential N-path filter unit 114 are included.

However, the notch filter in FIG. 20 is different from that in FIG. 16 in that capacitors 193 and 194 are provided in place of capacitors 93 and 94 in the differential N-path filter unit 114.

The capacitor 193 connects a positive-phase signal input line 171A to a positive-phase signal output line 172A in the differential N-path filter unit 114 (as a positive-phase connection capacitor) as is the case with a capacitor 91 in a differential N-path filter unit 14.

The capacitor 194 connects a negative-phase signal input line 171B to a negative-phase signal output line 172B in the differential N-path filter unit 114 (as a negative-phase connection capacitor) as is the case with a capacitor 92 in the differential N-path filter unit 14.

Herein, as illustrated in FIG. 17, in a frequency characteristic of the notch filter in FIG. 16, a peak at a frequency $f_L$ is the peak formed by downward shift of the peak at a frequency $f_0$ by the capacitors 91 and 92.

According to the capacitors 193 and 194 of the differential N-path filter unit 114, as is the case with the capacitors 91 and 92, the peak obtained by shifting the peak at the frequency $f_0$ to the lower frequency $f_L$ is formed.

Also, in the notch filter in FIG. 20, the capacitor 81 which decreases an input reflection coefficient S11 to obtain an effect of realizing impedance matching is provided between the differential N-path filter units 14 and 114.

From above, the frequency characteristic of the notch filter in FIG. 20 is the characteristic in which a large peak of an attenuation amount is located at the frequency $f_L$.

<Eighth Embodiment of Notch Filter>

Figure 21:
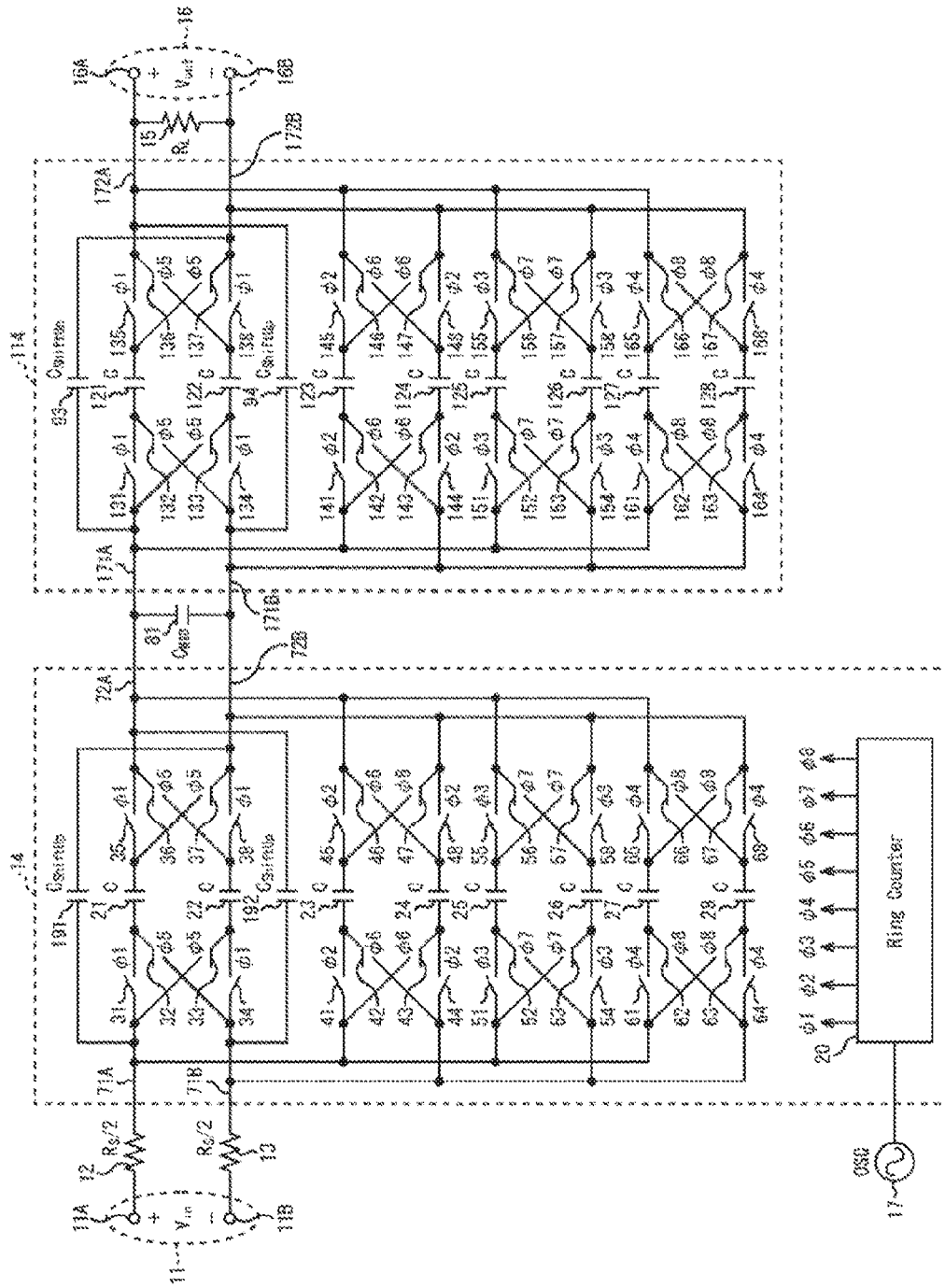
FIG. 21 is a block diagram illustrating a configuration example of an eighth embodiment of a notch filter to which the present technology is applied.

FIG. 21 is a block diagram, illustrating a configuration example of an eighth embodiment of a notch filter to which the present technology is applied.

Meanwhile, in the drawing, a portion corresponding to that in FIG. 16 is assigned with the same reference sign, and description thereof is hereinafter appropriately omitted.

In FIG. 21, the notch filter is the same as that in FIG. 16 in that components from a differential input terminal 11 to a clock oscillator 17, a capacitor 81, and a differential N-path filter unit 114 are included.

However, the notch filter in FIG. 21 is different from that in FIG. 16 in that capacitors 191 and 192 are provided in place of capacitors 91 and 92 in the differential N-path filter unit 14.

The capacitor 191 connects a positive-phase signal input line 71A to a negative-phase signal output line 72B in the differential N-path filter unit 14 (as a positive-phase/negative-phase connection capacitor) as is the case with a capacitor 93 in the differential N-path filter unit 114.

The capacitor 194 connects a negative-phase signal input line 71B to a positive-phase signal output line 72A in the differential N-path filter unit 14 (as a negative-phase/positive-phase connection capacitor) as is the case with a capacitor 94 in the differential N-path filter unit 114.

Herein, as illustrated in FIG. 17, in a frequency characteristic of the notch filter in FIG. 16, a peak at a frequency $f_H$ is the peak formed by upward shift of the peak at a frequency $f_0$ by the capacitors 93 and 94.

According to the capacitors 191 and 192 of the differential N-path filter unit 14, as is the case with the capacitors 93 and 94, the peak obtained by shifting the peak at the frequency $f_O$ to the upper frequency $f_H$ is formed.

Also, in the notch filter in FIG. 21, the capacitor 81 which decreases an input reflection coefficient S11 to obtain an effect of realizing impedance matching is provided between the differential N-path filter units 14 and 114.

From above, the frequency characteristic of the notch filter in FIG. 21 is the characteristic in which a large peak of an attenuation amount is located at the frequency $f_H$.

<Ninth Embodiment of Notch Filter>

Figure 22:
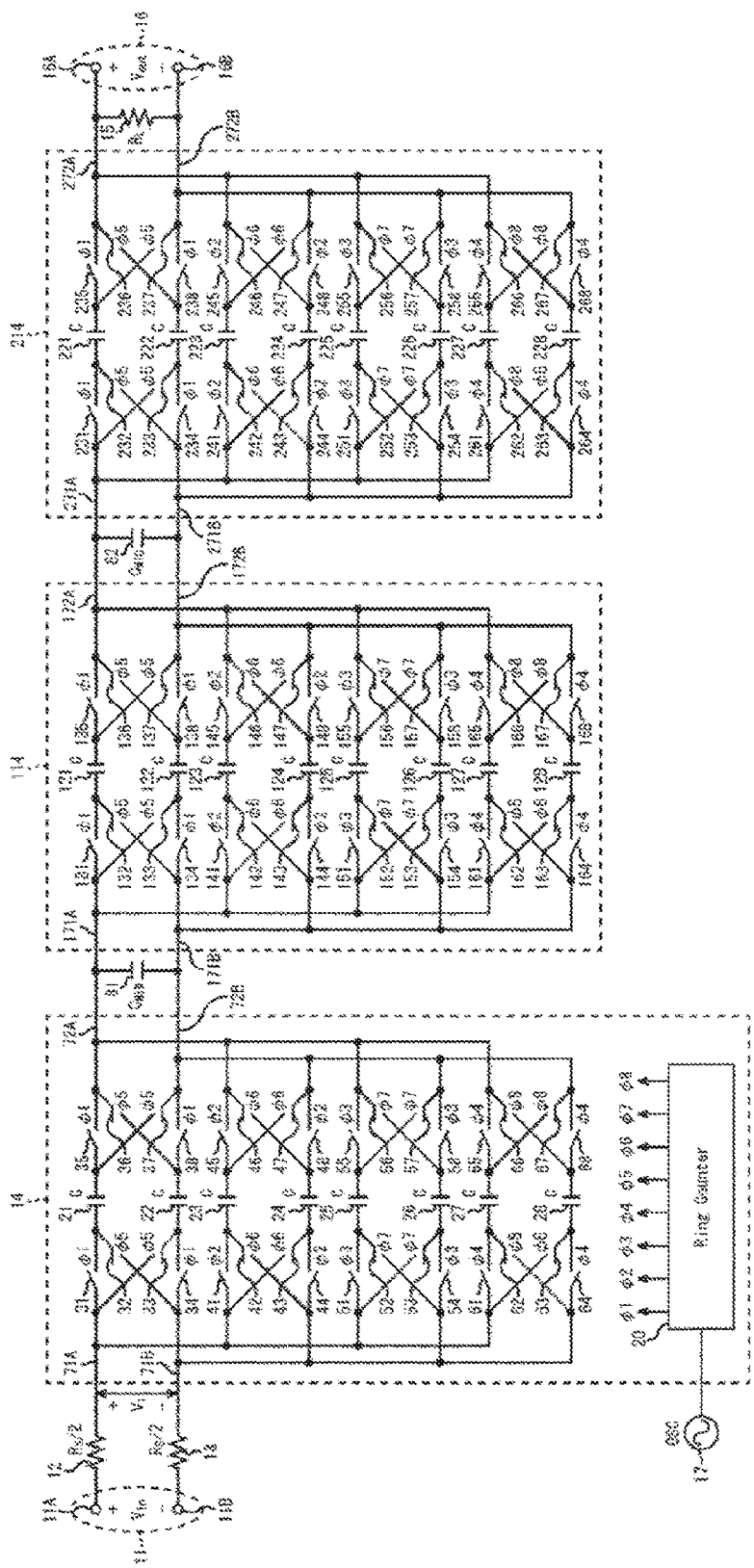
FIG. 22 is a block diagram illustrating a configuration example of a ninth embodiment of a notch filter to which the present technology is applied.

FIG. 22 is a block diagram illustrating a configuration example of a ninth embodiment of a notch filter to which the present technology is applied.

Meanwhile, in the drawing, a portion corresponding to that in FIG. 6 is assigned with the same reference sign, and description thereof is hereinafter appropriately omitted.

In FIG. 22, the notch filter includes a differential input terminal 11, resistances 12 and 13, a differential N-path filter unit 14, a resistance 15, a differential output terminal 16, a clock oscillator 17, capacitors 81 and 82, and differential N-path filter units 114 and 214.

Therefore, the notch filter in FIG. 22 is the same as that in FIG. 6 in that components from the differential input terminal 11 to the clock oscillator 17, the capacitor 81, and the differential N-path filter unit 114 are included.

However, the notch filter in FIG. 22 is different from that in FIG. 6 in that the capacitor 82 and the differential N-path filter unit 214 are newly provided.

The differential N-path filter 214 is configured so as to be similar to the differential N-path filter unit 114.

Therefore, the differential N-path filter unit 214 filters a differential signal input thereto as is the case with the differential N-path filter unit 114 to output.

The differential N-path filter unit 214 includes capacitors 221 to 228, switches 231 to 238, 241 to 248, 251 to 258, and 261 to 268, a positive-phase signal input line 271A, a negative-phase signal input line 271B, a positive-phase signal output line 272A, and a negative-phase signal output line 272B.

Components from the capacitor 221 to the negative-phase signal output line 272B of the differential N-path filter unit 214 are configured so as to be similar to components from a capacitor 121 to a negative-phase signal output line 172B of the differential N-path filter unit 114, respectively.

Therefore, the switches 231 to 238, 241 to 248, 251 to 258, and 261 to 268 of the differential N-path filter unit 214 are turned on/off according to driving pulses phi in FIG. 2 output by a ring counter 20 as is the case with switches 131 to 138, 141 to 148, 151 to 158, and 161 to 168 of the differential N-path filter unit 114.

In FIG. 22, the differential N-path filter units 14, 114, and 214 as three N-path filters are cascade-connected in three stages.

That is to say, in FIG. 22, the differential N-path filter units 14 and 114 are connected to each other as illustrated in FIG. 6.

Furthermore, in FIG. 22, a positive-phase signal output line 172A of the differential N-path filter unit 114 and the positive-phase signal input line 271A of the differential N-path filter unit 214 are connected to each other. Furthermore, the negative-phase signal output line 172B of the differential N-path filter unit 114 and the negative-phase signal input line 271B of the differential N-path filter unit 214 are connected to each other.

Also, in FIG. 22, the positive-phase signal output line 272A of the differential N-path filter unit 214 is connected to a positive-phase output terminal 16A to which one end of the resistance 15 is connected. Furthermore, the negative-phase signal output line 272B of the differential N-path filter unit 214 is connected to a negative-phase output terminal 16B to which the other end of the resistance 15 is connected.

Then, in FIG. 22, the capacitor 81 is inserted to a connection point of the differential N-path filter units 14 and 114 as interstage capacitance as illustrated in FIG. 6.

Furthermore, in FIG. 22, the capacitor 82 is inserted to a connection point of the differential N-path filter units 114 and 214 as interstage capacitance.

That is to say, the capacitor 82 is inserted between a connection point of the positive-phase signal output line 172A of the differential N-path filter unit 114 and the positive-phase signal input line 271A of the differential N-path filter unit 214 on a next stage and a connection point of the negative-phase signal output line 172B of the differential N-path filter unit 114 and the negative-phase signal input line 271B of the differential N-path filter unit 214 on the next stage.

In the notch filter configured in the above-described manner, the differential signal input from the differential input terminal 11 is filtered by the differential N-path filter unit 14 and is further filtered by the differential N-path filter unit 114 as illustrated in FIG. 6.

A positive-phase signal out of the differential signal filtered by the differential N-path filter unit 114 is output from the positive-phase signal output line 172A to be input to the positive-phase signal input line 271A of the differential N-path filter unit 214. Also, a negative-phase signal out of the differential signal filtered by the differential N-path filter unit 114 is output from the negative-phase signal output line 172B to be input to the negative-phase signal input line 271B of the differential N-path filter unit 214.

The differential signal formed of the positive-phase signal input to the positive-phase signal input line 271A and the negative-phase signal input to the negative-phase signal input line 271B is filtered by the differential N-path filter unit 214.

Then, the positive-phase signal out of the filtered differential signal is output from the positive-phase signal output line 272A to be supplied to the positive-phase output terminal 16A. Furthermore, the negative-phase signal out of the filtered differential signal is output from the negative-phase signal output line 272B to be supplied to the negative-phase output terminal 16B.

The notch filter in FIG. 22 in which the differential N-path filter units 14, 114, and 214 are cascade-connected in three stages may increase an attenuation amount as compared to the notch filter in FIG. 6 in which the differential N-path filter units 14 and 114 are cascade-connected in two stages.

Meanwhile, in FIG. 22, one or more N-path filters out of the differential N-path filter units 14, 114, and 214 may be provided with capacitors 91 and 92 illustrated in FIG. 11.

Also, in FIG. 22, one or more N-path filters out of the differential N-path filter units 14, 114, and 214 may be provided with capacitors 93 and 94 illustrated in FIG. 14.

Furthermore, in FIG. 22, it is possible to provide the capacitors 91 and 92 illustrated in FIG. 11 in one or more N-path filters out of the differential N-path filter units 14, 114, and 214 and provide the capacitors 93 and 94 illustrated in FIG. 14 in one or more of other N-path filters.

Also, the notch filter may be formed of cascade connection of two or three N-path filters (differential N-path filter units 14, 114, and 214) or cascade connection of four or more N-path filters as illustrated in FIGS. 6 and 22.

<Tenth Embodiment of Notch Filter>

Figure 23:
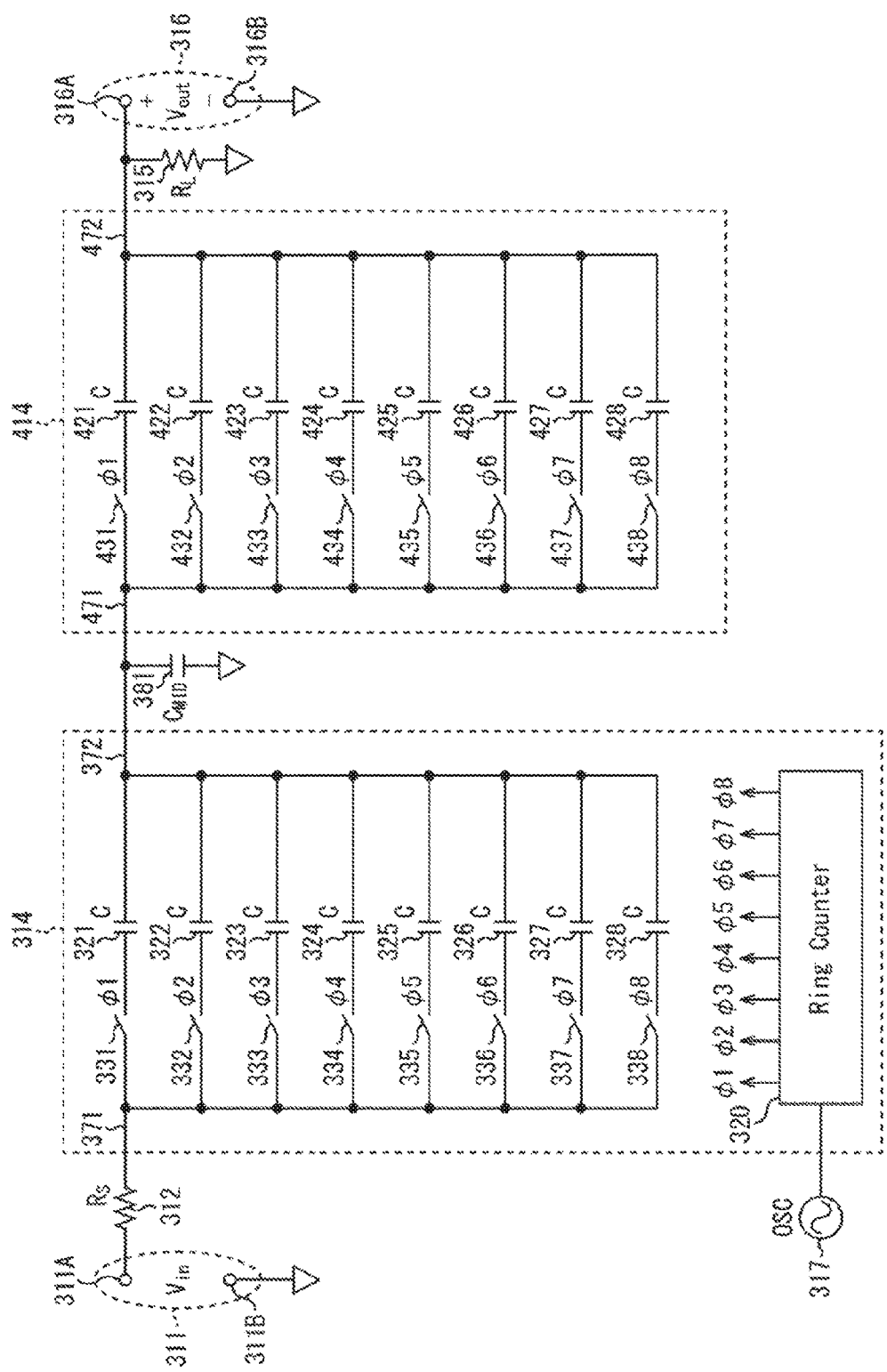
FIG. 23 is a block diagram illustrating a configuration example of a tenth embodiment of a notch filter to which the present technology is applied.

FIG. 23 is a block diagram illustrating a configuration example of a tenth embodiment of a notch filter to which the present technology is applied.

The notch filter in FIG. 23 is formed of an N-path filter having eight paths (eight-path filter) as is the case with first to tenth embodiments.

However, in the notch filter in FIG. 23, not a differential signal but a single-end signal is input as an input signal Vin and filtering to eliminate (a frequency component of) a partial band of the single-end signal is performed thereon. Then, the filtered single-end signal is output as an output signal Vout.

In FIG. 23, the notch filter includes a single-end input terminal 311, a resistance 312, an N-path filter unit 314, a resistance 315, a single-end output terminal 316, a clock oscillator 317, a capacitor 381, and an N-path filter unit 414.

The single-end input terminal 311 includes an input terminal 311A to which the single-end signal is input and a GND terminal 311B connected to ground (GND).

The resistance 312 is a signal source resistance having a resistance value $R_S$: one end of which is connected to the input terminal 311A and the other end of which is connected to an input line 371 to be described later of the N-path filter unit 314.

The N-path filter unit 314 filters the single-end signal input to the single-end input terminal 311 to eliminate the partial band of the single-end signal and outputs the single-end signal after the elimination from an output line 372 to be described later.

The resistance 315 is a load resistance having a resistance value of $R_L$ serving as a load of the single-end signal output from the N-path filter unit 414. One end of the resistance 315 is connected to an output terminal 316A and the other end thereof is connected to the GND.

The single-end output terminal 316 includes the output terminal 316A from which the single-end signal is output and a GND terminal 316B connected to the GND.

The clock oscillator 317 generates a clock CLK of a predetermined frequency to supply to a ring counter 320 to be described later of the N-path filter unit 314 as is the case with a clock oscillator 17 in FIG. 1.

The N-path filter unit 314 includes the ring counter 320, capacitors 321 to 328, and switches 331 to 338.

Furthermore, the N-path filter unit 314 includes the input line 371 and the output line 372.

The ring counter 320 counts the clocks CLK supplied from the clock oscillator 317 to generate eight-phase driving pulses phi1 to phi8 similar to those of a ring counter 20 in FIG. 1. Then, the ring counter 320 supplies the driving pulses phi1 to phi8 to the switches 331 to 338, respectively.

When the switches 331 to 338 are turned on, each of the capacitors 321 to 328 is selected as a signal path through which a signal passes. When each of the capacitors 321 to 328 is selected, the capacitor which serves as the signal path is temporally switched.

Meanwhile, the capacitors 321 to 328 are the capacitors having the same capacitance C.

The switch 331 connects/disconnects the capacitor 321 to/from the input line 371 according to the driving pulse phi1.

The switch 332 connects/disconnects the capacitor 322 to/from the input line 371 according to the driving pulse phi2.

The switch 333 connects/disconnects the capacitor 323 to/from the input line 371 according to the driving pulse phi3.

The switch 334 connects/disconnects the capacitor 324 to/from the input line 371 according to the driving pulse phi4.

The switch 335 connects/disconnects the capacitor 325 to/from the input line 371 according to the driving pulse phi5.

The switch 336 connects/disconnects the capacitor 326 to/from the input line 371 according to the driving pulse phi6.

The switch 337 connects/disconnects the capacitor 327 to/from the input line 371 according to the driving pulse phi7.

The switch 338 connects/disconnects the capacitor 328 to/from the input line 371 according to the driving pulse phi8.

One end of the input line 371 is connected to the input terminal 311A through the resistance 312. The single-end signal is input from the input terminal 311A to the input line 371 through the resistance 312.

The other end of the input line 371 is connected to one end of the capacitor 321 through the switch 331 and connected to one end of the capacitor 322 through the switch 332.

Furthermore, the other end of the input line 371 is connected to one end of the capacitor 323 through the switch 333 and connected to one end of the capacitor 324 through the switch 334.

Also, the other end of the input line 371 is connected to one end of the capacitor 325 through the switch 335 and connected to one end of the capacitor 326 through the switch 336.

Furthermore, the other end of the input line 371 is connected to one end of the capacitor 327 through the switch 337 and connected to one end of the capacitor 328 through the switch 338.

One end of the output line 372 is connected to an input line 471 to be described later of the N-path filter unit 414. The single-end signal filtered by the N-path filter unit 314 is output from the output line 372.

The other end of the output line 372 is connected to the other ends of the capacitors 321 to 328.

The capacitor 381 is inserted to a connection point of the N-path filter units 314 and 414 as interstage capacitance.

That is to say, the capacitor 381 is inserted between a connection point of the output line 372 of the N-path filter unit 314 and the input line 471 of the N-path filter unit 414 on a next stage and the GND.

The N-path filter unit 414 is configured so as to be similar to the N-path filter unit 314 except that a block corresponding to the ring counter 320 is not provided.

Therefore, the N-path filter unit 414 filters the single-end signal input thereto as is the case with the N-path filter unit 314 to output.

The N-path filter unit 414 includes capacitors 421 to 428, switches 431 to 438, the input line 471, and the output line 472.

Components from the capacitor 421 to the output line 472 of the N-path filter unit 414 are configured so as to be similar to components from the capacitor 321 to the output line 372 of the N-path filter unit 314, respectively.

Therefore, the switches 431 to 438 of the N-path filter unit 414 are turned on/off according to driving pulses phi in FIG. 2 output by the ring counter 320 as is the case with the switches 321 to 338 of the N-path filter unit 314.

The N-path filter unit 414 is cascade-connected to a subsequent stage of the N-path filter unit 314 (the N-path filter units 314 and 414 form cascade connection in two stages).

That is to say, the input line 471 of the N-path filter unit 414 is connected to the output line 372 of the N-path filter unit 314.

Then, as described above, the capacitor 381 one end of which is connected to the GND is connected to the connection point of the output line 372 of the N-path filter unit 314 and the input line 471 of the N-path filter unit 414.

The output line 472 of the N-path filter unit 414 is connected to the output terminal 316A.

In the notch filter configured in the above-described manner, the signal-end signal input from the input terminal 311A to the input line 371 through the resistance 312 is filtered by the N-path filter unit 314.

The single-end signal filtered by the N-path filter unit 314 is output from the output line 372 to be input to the input line 471 of the N-path filter unit 414.

The single-end signal input to the input line 471 is filtered by the N-path filter 414.

Then, the filtered single-end signal is output from the output line 472 to be supplied to the output terminal 316A.

In the above-described manner, in the notch filter which filters the single-end signal, when the N-path filter units 314 and 414 are cascade-connected in two stages and the capacitor 381 is provided between the N-path filter units 314 and 314, impedance matching may be improved as is the case with the notch filter in FIG. 6 which filters the differential signal. As a result, it becomes possible to decrease the input reflection coefficient S11 of the notch filter and significantly increase the attenuation amount of the notch filter.

Meanwhile, although two N-path filters of the N-path filter units 314 and 414 are cascade-connected to form the notch filter in FIG. 23, it is also possible to form the notch filter by cascade-connecting three or more N-path filters and inserting the capacitor to a connection point of the N-path filters.

<Eleventh Embodiment of Notch Filter>

Figure 24:
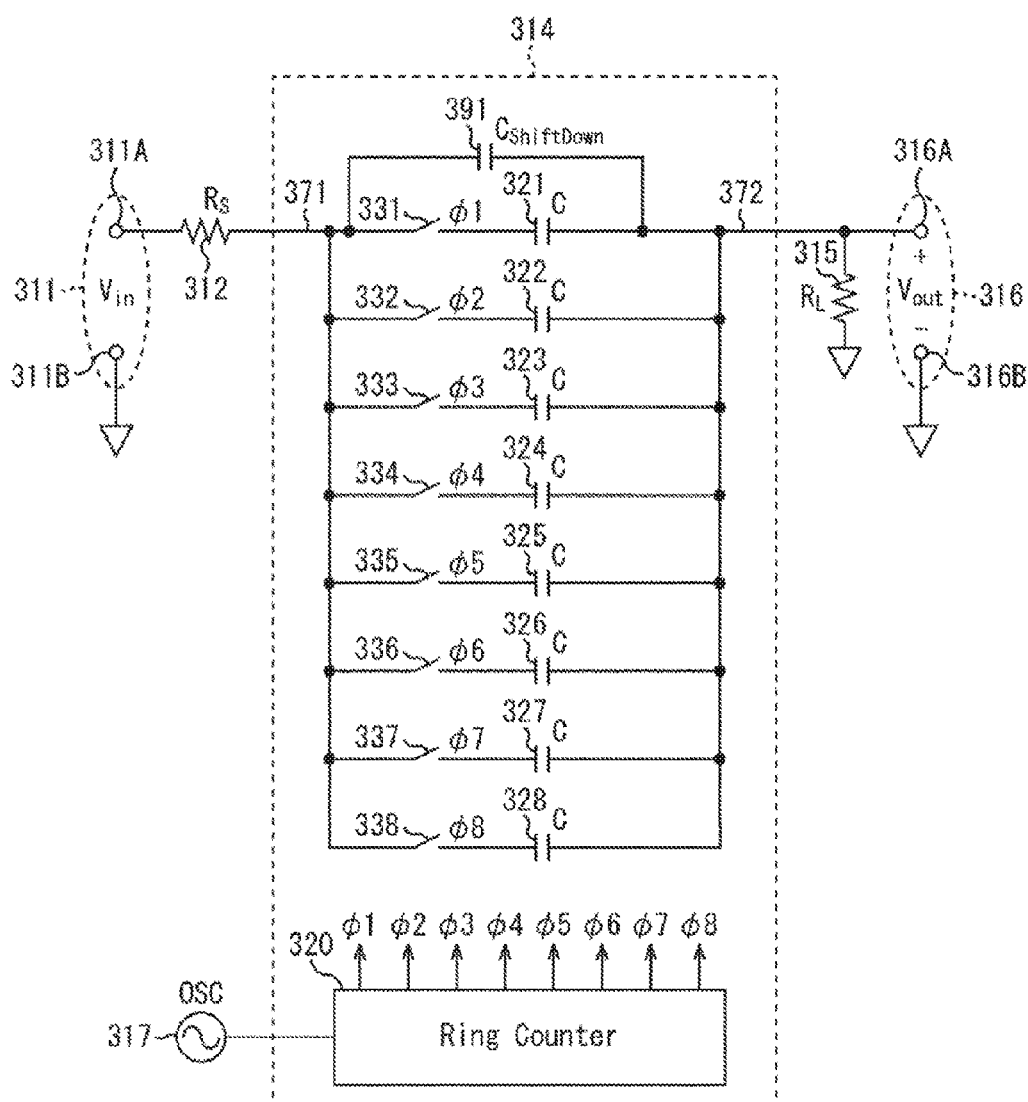
FIG. 24 is a block diagram illustrating a configuration example of an eleventh embodiment of a notch filter to which the present technology is applied.

FIG. 24 is a block diagram illustrating a configuration example of an eleventh embodiment of a notch filter to which the present technology is applied.

Meanwhile, in the drawing, a portion corresponding to that in FIG. 23 is assigned with the same reference sign, and description thereof is hereinafter appropriately omitted.

In FIG. 24, the notch filter is the same as that in FIG. 23 in that a single-end input terminal 311, a resistance 312, an N-path filter unit 314, a resistance 315, a single-end output terminal 316, and a clock oscillator 317 are included.

However, the notch filter in FIG. 24 is different from that in FIG. 23 in that a capacitor 391 is newly provided.

Furthermore, the notch filter in FIG. 24 is different from that in FIG. 23 in that an N-path filter 414 is not provided.

In the above-described manner, the notch filter in FIG. 24 is not provided with the N-path filter unit 414, so that an output line 372 of the N-path filter 314 is connected to the resistance 315 one end of which is connected to GND and an output terminal 316A.

The capacitor 391 is inserted between an input line 371 and the output line 372 as frequency shift capacitance to shift a central frequency of the notch filter as is the case with a capacitor 91 in FIG. 11.

That is to say, one end of the capacitor 391 is connected to the input line 371 and the other end of the capacitor 391 is connected to the output line 372. According to this, the capacitor 391 connects the input line 371 to the output line 372.

In the notch filter in FIG. 24, as is the case with the notch filter in FIG. 11 provided with the capacitors 91 and 92, the central frequency is decreased (shifts downward) as compared to the case in which the capacitor 391 is not provided.

That is to say, according to the notch filter in FIG. 24, it is possible to shift the central frequency downward from the central frequency in the case in which the capacitor 391 is not provided without changing a frequency of a clock CLK.

Herein, the capacitor 391 in FIG. 24 may be provided on one or both of the N-path filter units 314 and 414 in FIG. 23. When the capacitor 391 is provided on both the N-path filter units 314 and 414 in FIG. 23, as is the case with FIG. 20, it is possible to shift the central frequency downward to obtain a frequency characteristic with a large attenuation amount. When the capacitor 391 is provided on one of the N-path filter units 314 and 414 in FIG. 23, it is possible to enlarge a bandwidth of the frequency to be attenuated as is the case with FIG. 18.

Meanwhile, the embodiments of the present technology are not limited to the above-described embodiments and various modifications may be made without departing from the scope of the present technology.

For example, although eight is adopted as the number of paths N of the N-path filter such as the N-path filter unit 14 in this embodiment, the number of paths N is not limited to eight.

Also, the notch filter according to the present technology may be applied to a case in which an interferer/blocker of 13.56 MHz of NFC is eliminated in a receiver of BAN and a case in which a blocker is eliminated in other wireless communication, for example.

Furthermore, the notch filter according to the present technology may also be applied to a case in which an arbitrary frequency component is eliminated in an arbitrary device.

The effect described in this specification is illustrative only and is not limitative; there may also be another effect.

REFERENCE SIGNS LIST

11 Differential input terminal
11A Positive-phase input terminal
11B Negative-phase input terminal
12, 13 Resistance
14 Differential N-path filter unit
14A Mixer
14B HPF
14C Mixer
15 Resistance
16 Differential output terminal
16A Positive-phase output terminal
16B Negative-phase output terminal
17 Clock oscillator
20 Ring counter
21 to 28 Capacitor
31 to 38, 41 to 48, 51 to 58, 61 to 68 Switch
71A Positive-phase signal input line
71B Negative-phase signal input line
72A Positive-phase signal output line
72B Negative-phase signal output line
81, 82, 91 to 94 Capacitor
114 Differential N-path filter unit
121 to 128 Capacitor
131 to 138, 141 to 148, 151 to 158, 161 to 168 Switch
171A Positive-phase signal input line
171B Negative-phase signal input line
172A Positive-phase signal output line
172B Negative-phase signal output line
191 to 194 Capacitor 214 Differential N-path filter unit
221 to 228 Capacitor
231 to 238, 241 to 248, 251 to 258, 261 to 268 Switch
271A Positive-phase signal input line
271B Negative-phase signal input line
272A Positive-phase signal output line
272B Negative-phase signal output line
311 Single-end input terminal
311A Input terminal
311B GND terminal
312 Resistance
314 N-path filter unit
315 Resistance
316 Single-end output terminal
316A Output terminal
316B GND terminal
317 Clock oscillator
320 Ring counter
321 to 328 Capacitor
331 to 338 Switch
371 Input line
372 Output line
381, 391 Capacitor
414 N-path filter unit
421 to 428 Capacitor
431 to 438 Switch

The invention claimed is:

1. A notch filter comprising:
a plurality of cascade-connected N-path filter units in which any one of a plurality of N capacitors is selected as a signal path through which a signal passes, so that respective ones of the N capacitors serve as the signal path according to a control signal that varies with time, wherein
each of the N-path filter units includes
a positive-phase signal input line to which a positive-phase signal of a differential signal is input,
a negative-phase signal input line to which a negative-phase signal of the differential signal is input,
a positive-phase signal output line from which the positive-phase signal of the differential signal is output, and
a negative-phase signal output line from which the negative-phase signal of the differential signal is output; and
a capacitor directly connected between a first node and a second node, the first node being a connection point of the positive-phase signal output line of a first N-path filter unit of the N-path filter units and the positive-phase signal input line of a second N-path filter unit of the N-path filter units and the second node being a connection point of the negative-phase signal output line of the first one N-path filter unit and the negative-phase signal input line of the second N-path filter unit.

2. The notch filter according to claim 1, wherein at least one of the N-path filter units includes:
a positive-phase connection capacitor connecting the positive-phase signal input line to the positive-phase signal output line; and
a negative-phase connection capacitor connecting the negative-phase signal input line to the negative-phase signal output line for each of one or more of the N-path filter units.

3. The notch filter according to claim 1, wherein at least one of the N-path filter units includes:
a positive-phase/negative-phase connection capacitor connecting the positive-phase signal input line to the negative-phase signal output line; and
a negative-phase/positive-phase connection capacitor connecting the negative-phase signal input line to the positive-phase signal output line.

4. The notch filter according to claim 1, wherein at least one of the N-path filter units includes:
a positive-phase connection capacitor connecting the positive-phase signal input line to the positive-phase signal output line;
a negative-phase connection capacitor connecting the negative-phase signal input line to the negative-phase signal output line;
a positive-phase/negative-phase connection capacitor connecting the positive-phase signal input line to the negative-phase signal output line; and
a negative-phase/positive-phase connection capacitor connecting the negative-phase signal input line to the positive-phase signal output line.

* * * * *